United States Patent
Ortiz et al.

(10) Patent No.: US 11,950,377 B1
(45) Date of Patent: Apr. 2, 2024

(54) FLEXIBLE INTERCONNECT CIRCUITS FOR BATTERY PACKS

(71) Applicant: CelLink Corporation, San Carlos, CA (US)

(72) Inventors: Jean-Paul Ortiz, White Lake, MI (US); Malcom Parker Brown, Mountain View, CA (US); Casey Anderson, San Carlos, CA (US); Will Findlay, San Carlos, CA (US); Gabrielle Tate, Royal Oak, MI (US); Shawn D'Gama, Wixom, MI (US); Arturo Cantu-Chavez, San Carlos, CA (US)

(73) Assignee: CelLink Corporation, San Carlos, CA (US)

( * ) Notice: Subject to any disclaimer, the term of this patent is extended or adjusted under 35 U.S.C. 154(b) by 0 days.

(21) Appl. No.: 18/300,828

(22) Filed: Apr. 14, 2023

Related U.S. Application Data

(60) Provisional application No. 63/363,032, filed on Apr. 15, 2022.

(51) Int. Cl.
*H05K 1/02* (2006.01)
*H05K 1/11* (2006.01)
*H05K 3/46* (2006.01)

(52) U.S. Cl.
CPC ............ *H05K 3/46* (2013.01); *H05K 1/0201* (2013.01); *H05K 1/118* (2013.01); *H05K 2201/10037* (2013.01)

(58) Field of Classification Search
CPC ............... H05K 1/0201; H05K 1/0296; H05K 2201/093; H05K 2201/09663
See application file for complete search history.

(56) References Cited

U.S. PATENT DOCUMENTS

| | | |
|---|---|---|
| 3,750,278 A | 8/1973 | Oberg et al. |
| 4,818,840 A | 4/1989 | Booth et al. |

(Continued)

FOREIGN PATENT DOCUMENTS

| | | |
|---|---|---|
| CN | 203715762 U | 7/2014 |
| EP | 3496180 A1 | 6/2019 |

(Continued)

OTHER PUBLICATIONS

Nagarajan Palavesam et al.; "Roll-to-roll processing of film substrates for hybrid integrated flexible electronics" Flexible and Printed Electronics, Feb. 2018.

*Primary Examiner* — Livius R. Cazan
(74) *Attorney, Agent, or Firm* — Polygon IP, LLP

(57) ABSTRACT

Provided are flexible interconnect circuits comprising signal circuit elements. For example, a signal circuit element can be formed from the same metal sheet as a signal trace, thereby being monolithic with the signal circuit element. This integration of signal circuit elements into a flexible interconnect circuit reduces the number of additional operations and components (e.g., attaching external circuit elements). In some examples, a flexible interconnect circuit is used in a battery pack for interconnecting batteries while providing external terminals on the same side of the pack. Specifically, a flexible interconnect circuit comprises an interconnecting conductive layer (for connecting to batteries) and a return conductive layer, both extending between the first and second circuit edges. Each of these conductive layers comprises a corresponding external terminal at the first edge, while these layers are interconnected at the second edge. Otherwise, these layers are isolated from each other between the circuit edges.

19 Claims, 29 Drawing Sheets

(56) References Cited

U.S. PATENT DOCUMENTS

| | | |
|---|---|---|
| 5,262,594 A | 11/1993 | Edwin et al. |
| 5,645,932 A | 7/1997 | Uchibori |
| 6,010,771 A | 1/2000 | Isen et al. |
| 6,036,809 A | 3/2000 | Kelly et al. |
| 6,332,909 B1 | 12/2001 | Teshima et al. |
| 6,787,732 B1 | 9/2004 | Xuan et al. |
| 6,881,923 B2 | 4/2005 | Battaglia |
| 6,992,001 B1 | 1/2006 | Lin |
| 7,497,004 B2 | 3/2009 | Cote et al. |
| 7,633,035 B2 | 12/2009 | Kirmeier |
| 8,510,934 B2 | 8/2013 | Brand et al. |
| 8,931,166 B2 | 1/2015 | Marttila |
| 9,147,875 B1 | 9/2015 | Coakley et al. |
| 9,214,607 B1 | 12/2015 | Andrews |
| 9,466,777 B2 | 10/2016 | Coakley et al. |
| 9,468,090 B2 * | 10/2016 | Sabavat ............... H05K 1/0224 |
| 9,671,352 B2 | 6/2017 | Woo et al. |
| 9,692,030 B2 | 6/2017 | Schüssler et al. |
| 9,730,333 B2 | 8/2017 | Li et al. |
| 10,008,403 B2 | 6/2018 | Rumsby |
| 10,153,570 B2 | 12/2018 | Coakley et al. |
| 10,211,443 B2 | 2/2019 | Coakley et al. |
| 10,694,618 B2 | 6/2020 | Coakley et al. |
| 11,108,175 B2 | 8/2021 | Coakley et al. |
| 11,116,070 B2 | 9/2021 | Coakley et al. |
| 11,545,773 B2 | 1/2023 | Coakley et al. |
| 2001/0006766 A1 | 7/2001 | O'Brien et al. |
| 2002/0046856 A1 | 4/2002 | Alcoe |
| 2002/0050489 A1 | 5/2002 | Ikegami et al. |
| 2003/0062347 A1 | 4/2003 | Song et al. |
| 2006/0032665 A1 | 2/2006 | Ice |
| 2007/0171129 A1 | 7/2007 | Coleman et al. |
| 2007/0193027 A1 | 8/2007 | Takakusaki et al. |
| 2008/0017971 A1 | 1/2008 | Hollis |
| 2008/0083715 A1 | 4/2008 | Kirmeier |
| 2008/0128397 A1 | 6/2008 | Gandhi |
| 2009/0007421 A1 | 1/2009 | Chen et al. |
| 2010/0031996 A1 | 2/2010 | Basol |
| 2011/0001670 A1 | 1/2011 | Coleman et al. |
| 2011/0089212 A1 | 4/2011 | Schmid et al. |
| 2012/0164490 A1 | 6/2012 | Itoi et al. |
| 2012/0171527 A1 | 7/2012 | Hiroma |
| 2012/0227907 A1 | 9/2012 | Arakawa et al. |
| 2013/0055555 A1 | 3/2013 | Forster et al. |
| 2013/0170155 A1 * | 7/2013 | Kashiwakura ........... H05K 1/18 361/748 |
| 2013/0260191 A1 | 10/2013 | Takahashi et al. |
| 2014/0268780 A1 | 9/2014 | Wang et al. |
| 2015/0023584 A1 | 1/2015 | Rudin |
| 2015/0228956 A1 | 8/2015 | Schüssler et al. |
| 2015/0270190 A1 | 9/2015 | Kim et al. |
| 2016/0181579 A1 | 6/2016 | Geshi et al. |
| 2016/0207287 A1 | 7/2016 | Kim |
| 2016/0315304 A1 | 10/2016 | Biskup |
| 2016/0366768 A1 | 12/2016 | Matsuda |
| 2017/0012331 A1 | 1/2017 | Ng et al. |
| 2017/0214033 A1 | 7/2017 | Takano et al. |
| 2018/0034023 A1 | 2/2018 | Newman et al. |
| 2018/0205048 A1 | 7/2018 | Enomoto et al. |
| 2018/0294536 A1 | 10/2018 | Kruszelnicki |
| 2019/0097204 A1 | 3/2019 | Liposky et al. |
| 2019/0181419 A1 | 6/2019 | Suba et al. |
| 2019/0218142 A1 | 7/2019 | Logunov et al. |
| 2019/0296281 A1 | 9/2019 | Elsberry |
| 2019/0312251 A1 | 10/2019 | Matthews |
| 2019/0341585 A1 | 11/2019 | Shi et al. |
| 2020/0220120 A1 | 7/2020 | Day et al. |
| 2022/0109256 A1 | 4/2022 | Coakley et al. |
| 2022/0109258 A1 | 4/2022 | Coakley et al. |
| 2022/0311103 A1 | 9/2022 | Findlay et al. |

FOREIGN PATENT DOCUMENTS

| | | |
|---|---|---|
| KR | 20150058939 A | 5/2015 |
| WO | 2019150740 A1 | 8/2019 |

\* cited by examiner

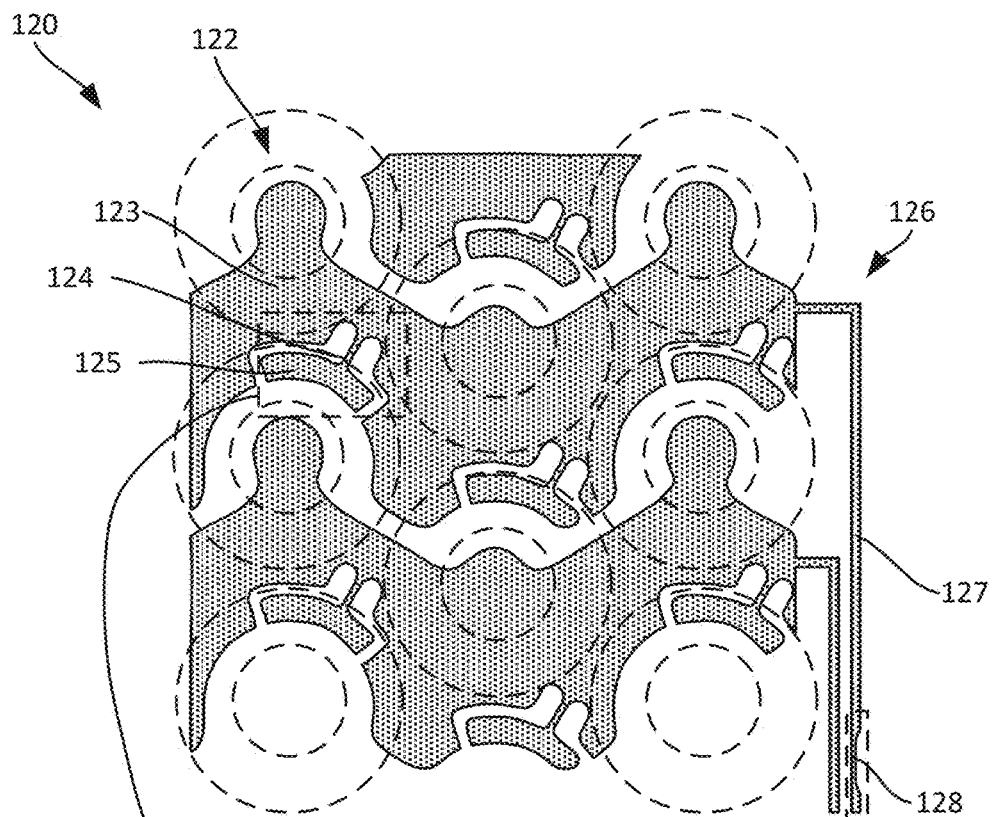
FIG. 4C
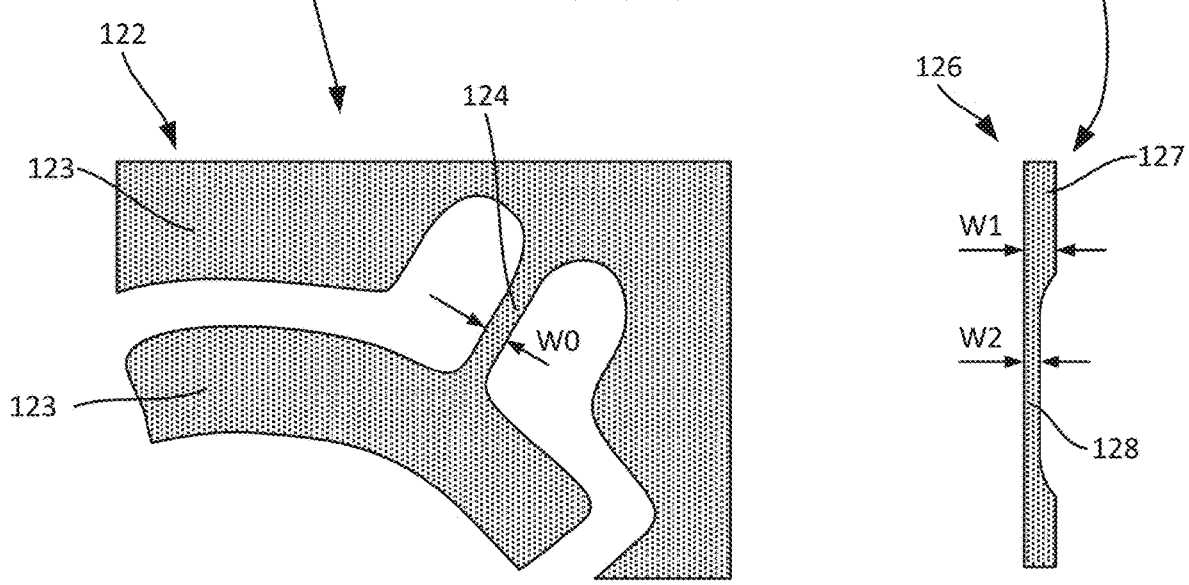
FIG. 4D
FIG. 4E

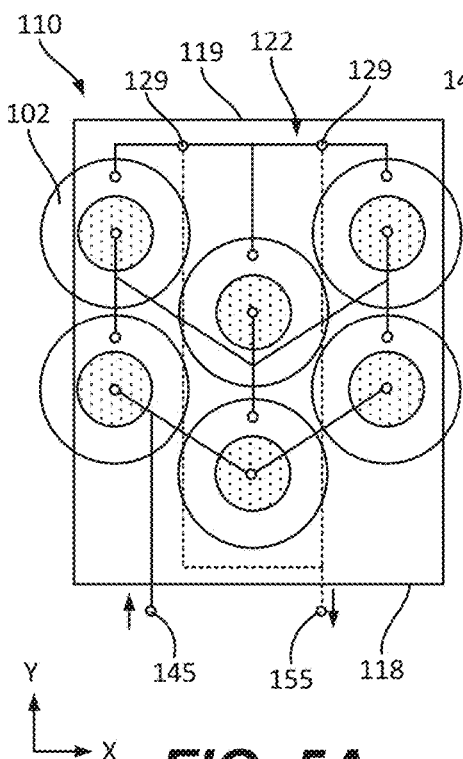
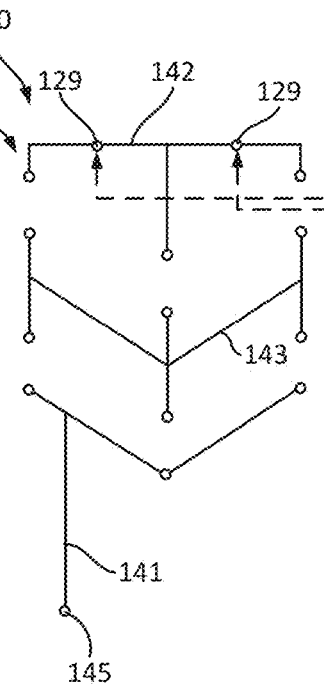
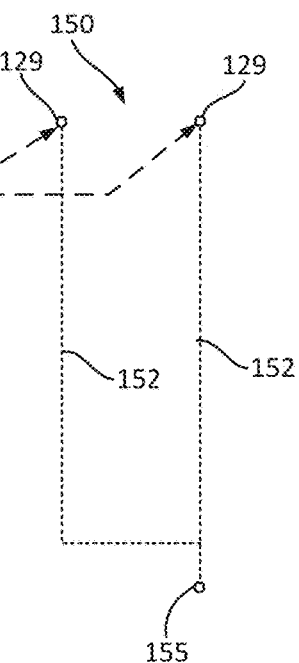
*FIG. 5A*   *FIG. 5B*   *FIG. 5C*
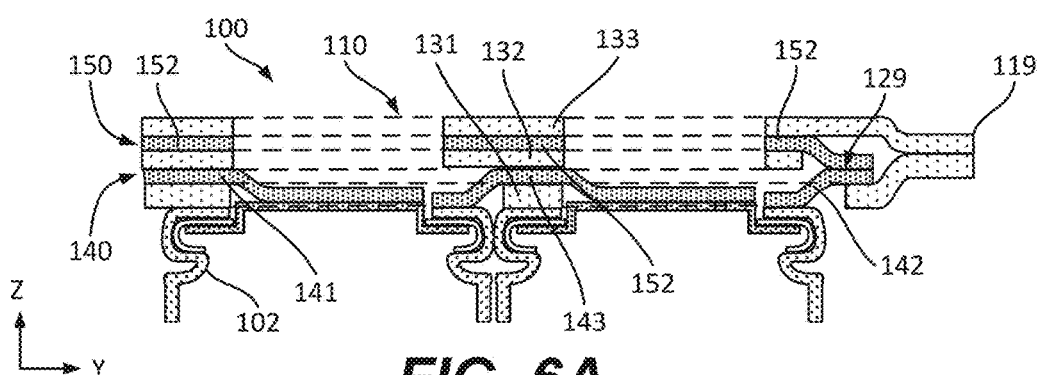
*FIG. 6A*
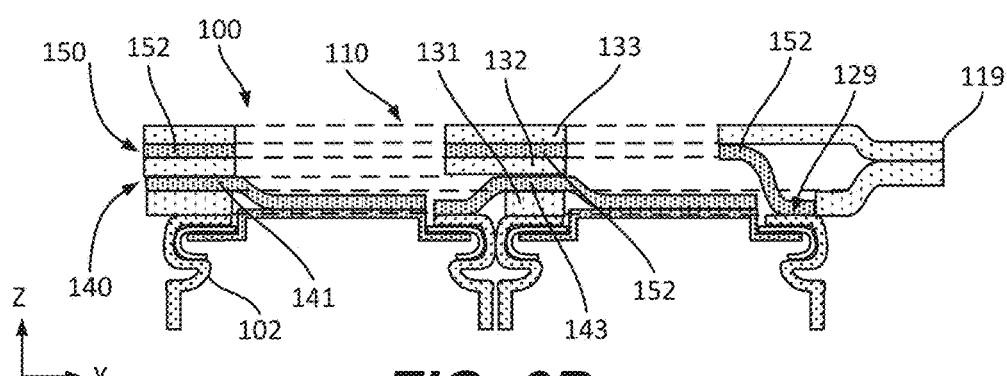
*FIG. 6B*

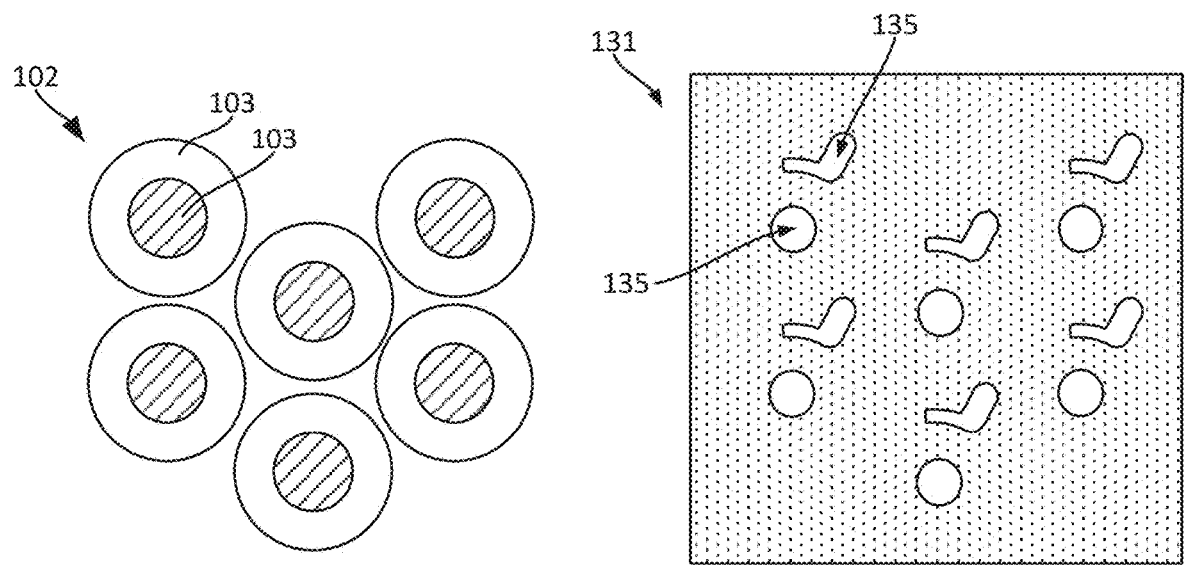
FIG. 7A
FIG. 7B
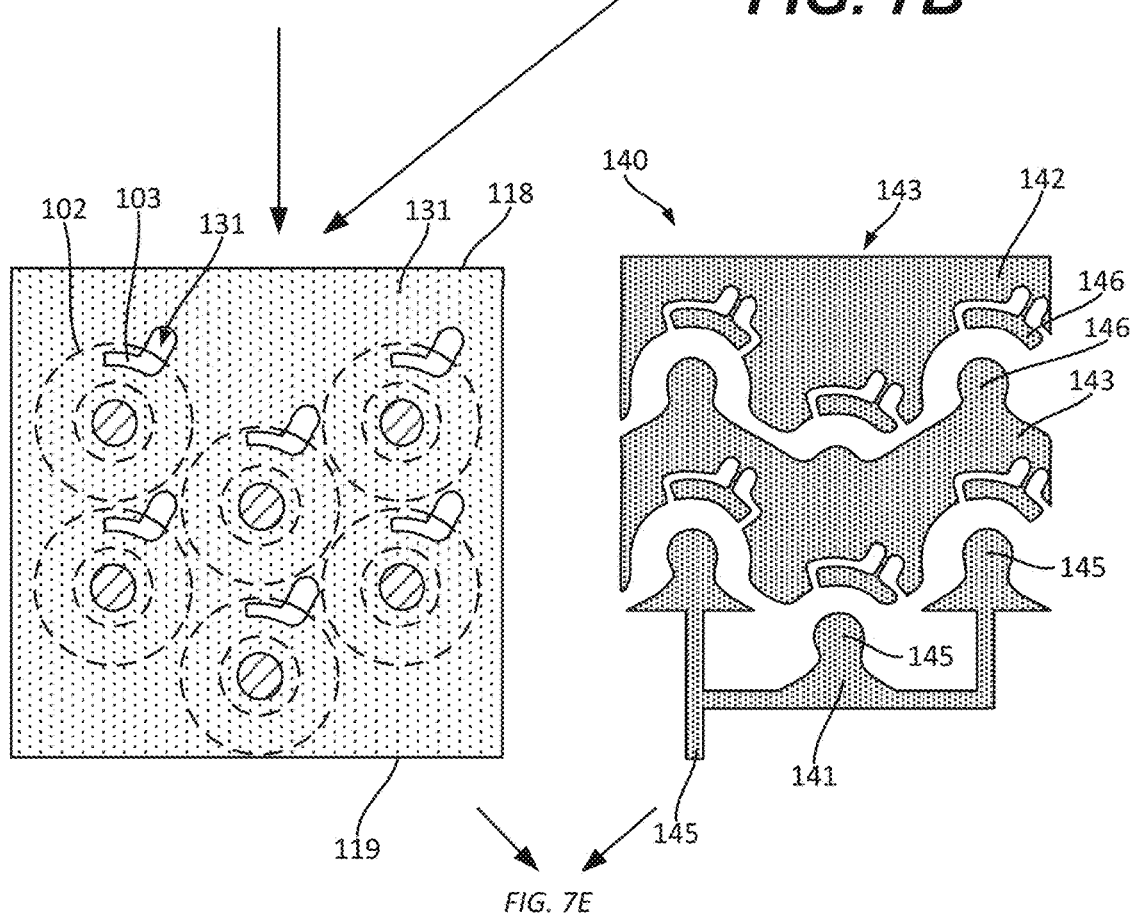
FIG. 7C
FIG. 7D

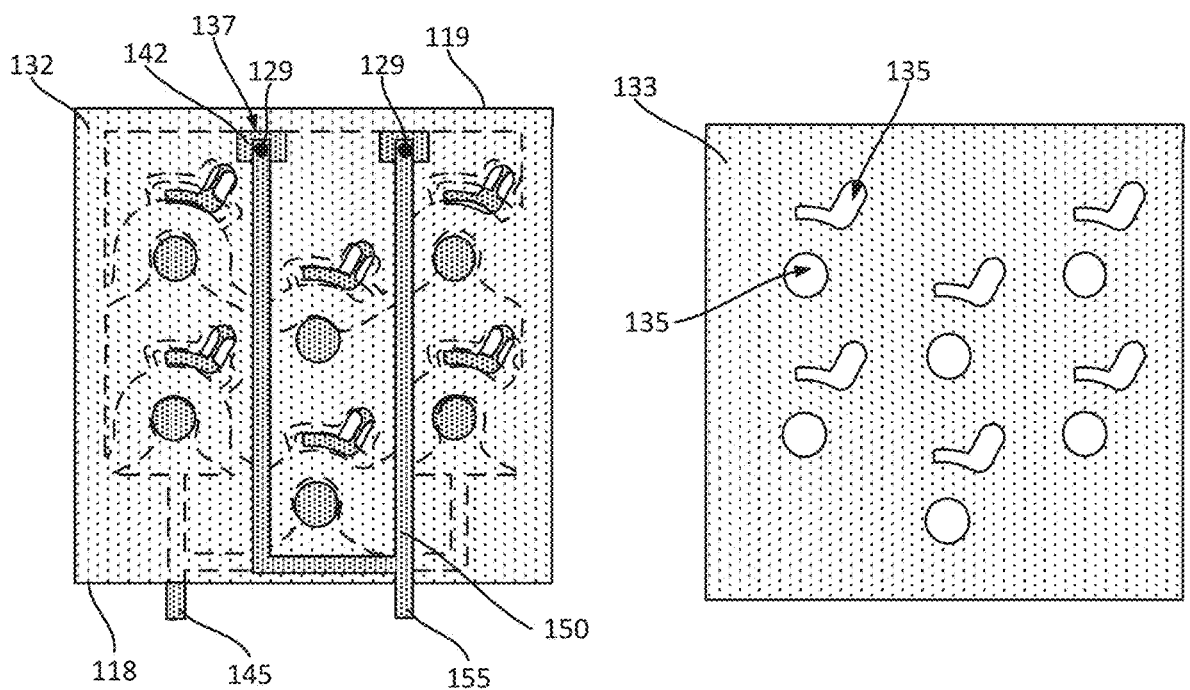
FIG. 7I
FIG. 7J
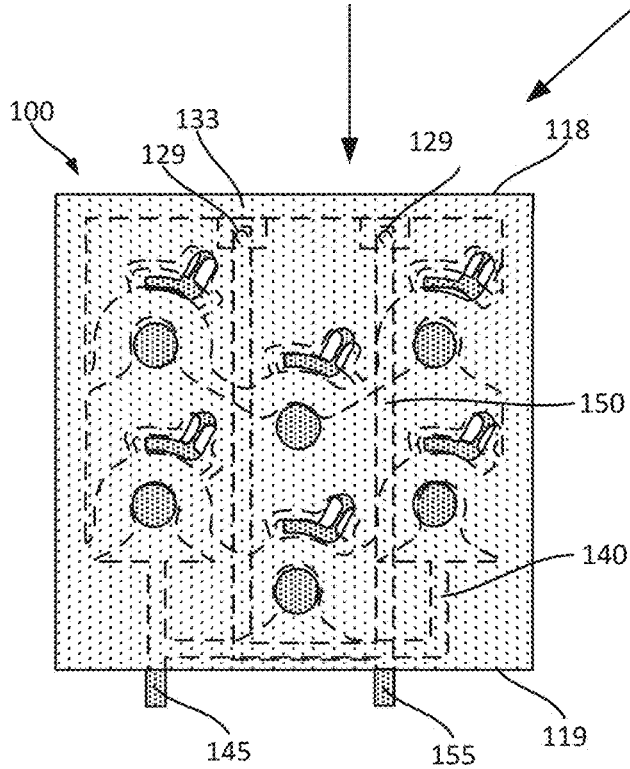
FIG. 7K

Prismatic battery swelling

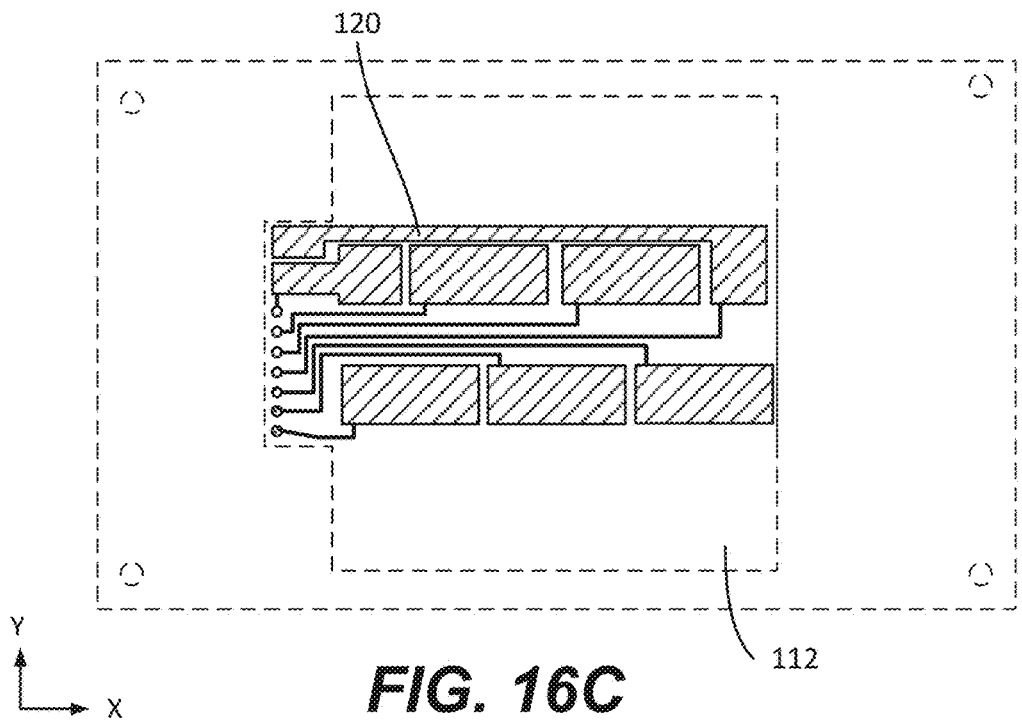
FIG. 16C
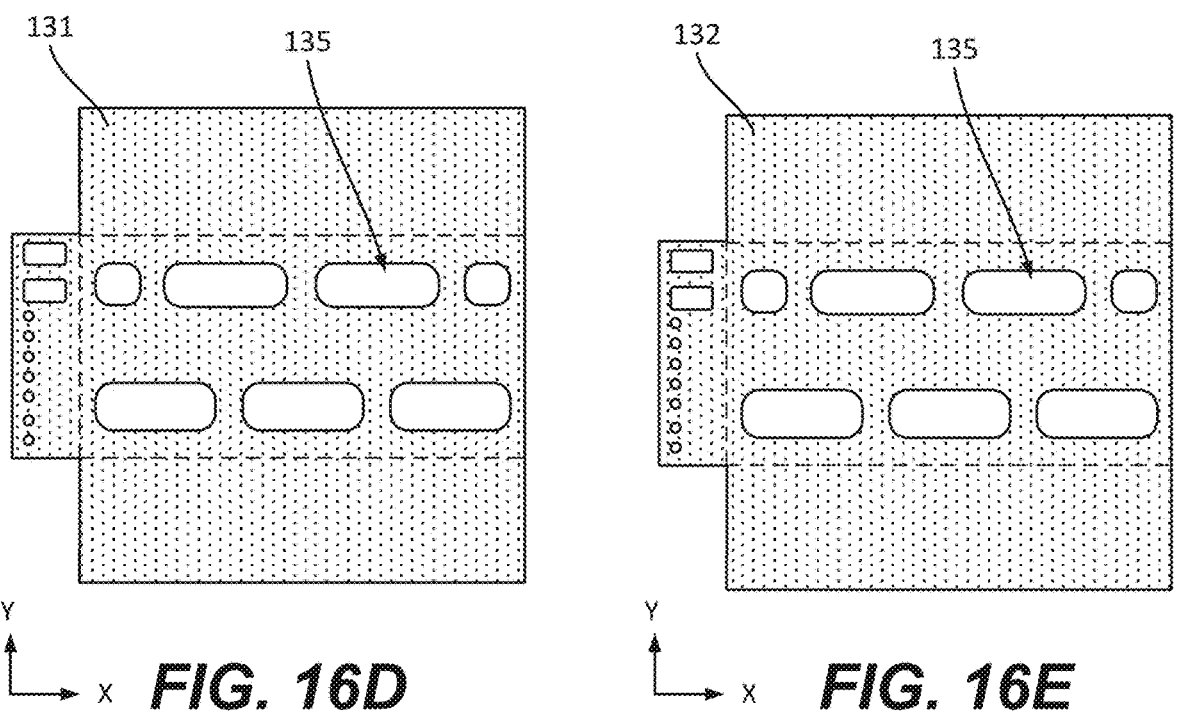
FIG. 16D  FIG. 16E

FLEXIBLE INTERCONNECT CIRCUITS FOR BATTERY PACKS

CROSS-REFERENCE TO RELATED APPLICATIONS

This application claims the benefit under 35 U.S.C. § 119(e) of U.S. Provisional Patent Application 63/363,032 by Jean-Paul Ortiz, et al., entitled: "Flexible interconnect circuits with Integrated Circuit Elements", filed on 2022 Apr. 15, which is incorporated herein by reference in its entirety for all purposes.

BACKGROUND

Electrical power and control signals are typically transmitted to individual components (e.g., in vehicles or any other types of machinery/systems) using multiple wires bundled together in a harness. These wire bundles can be bulky and difficult to route and support. In another example, batteries (in battery packs) are interconnected using bulky bus bars that lack flexibility and generally do not have any other functionality. For example, in-series connections of batteries often require separate return bus bars to ensure that battery pack terminals are positioned on the same side. These limitations result in added complexity and costs in various interconnect applications as well as limit applications of some interconnects.

What is needed are new circuit types, such as flexible interconnect circuits, that overcome various challenges associated with conventional wire bundles and bus-bar interconnects.

SUMMARY

Provided are flexible interconnect circuits comprising integrated circuit elements. For example, an integrated circuit element can be formed from the same metal sheet as a signal trace, thereby being monolithic with the signal trace. This integration of circuit elements into a flexible interconnect circuit reduces the number of additional operations and components (e.g., attaching external circuit elements). In some examples, a flexible interconnect circuit is used in a battery pack for interconnecting batteries while providing external terminals on the same side of the pack. Specifically, a flexible interconnect circuit comprises an interconnecting conductive layer (for connecting to batteries) and a return conductive layer, both extending between the first and second circuit edges. Each of these conductive layers comprises a corresponding external terminal at the first edge, while these layers are interconnected at the second edge. Otherwise, these layers are isolated from each other between the circuit edges.

In some examples, a flexible interconnect circuit comprises a first insulator layer, a second insulator layer, a signal trace at least partially extending between the first insulator layer and the second insulator layer, and a signal circuit element having a thickness of at least 100 micrometers and monolithic with the signal trace, wherein the signal circuit element is selected from the group consisting of a fusible link, a balancing resistor, a capacitor, and a controller. For example, the signal circuit element has a thickness of between 100 micrometers and 125 micrometers.

In some examples, the thickness of the signal trace is the same as the thickness of the signal circuit element. At the same time, the signal trace has a width less than the width of the signal circuit element. In some examples, both the signal trace and the signal circuit element have a substantially rectangular cross-section.

In some examples, the signal circuit element comprises a first side, a second side, a third side opposite of and parallel to the first side, and a fourth side opposite of the second side. The first side extends between the second side and the fourth side. The third side extends between the second side and the fourth side. The angle between the first side and the second side is between 90° and 135°. In some examples, the first side is narrower than the third side. For example, the second side and the fourth side are not parallel. In some examples, the angle between the second side and the fourth side is less than 160°. In some examples, the ratio of the cross-sectional area of the signal circuit element to the cross-sectional area of the signal trace is between 10% and 90%.

In some examples, the signal circuit element extends over a straight line and has a constant cross-section. In the same or other examples, the signal circuit element does not overlap with and does not directly contact either the first insulator layer or the second insulator layer. Alternatively, the signal circuit element overlaps with and directly contacts the first insulator layer but not the second insulator layer. In some examples, the signal circuit element overlaps with and directly contacts both the first insulator layer and the second insulator layer. In some examples, the signal circuit element is a fusible link with a fusible current of between 8 Amps and 12 Amps.

In some examples, the flexible interconnect circuit further comprises a power trace. The thickness of the power trace is the same as the thickness of the signal trace. The material of the power trace is the same as the material of the signal trace. The average width of the power trace is at least 10 times greater than the average width of the signal trace. In more specific examples, the flexible interconnect circuit further comprises a power circuit element monolithic with the power trace, wherein the power circuit element is selected from the group consisting of a fusible link, a balancing resistor, a capacitor, and a controller. In some examples, the power trace is monolithic with the signal trace. Furthermore, in some examples, the power circuit element is the fusible link. For example, the fusible link may be configured for a fusible current of between 30 Amps and 70 Amps. In some examples, the signal trace and the signal circuit element are formed from aluminum.

In some examples, a flexible interconnect circuit for interconnecting batteries in a battery pack is provided. The flexible interconnect circuit comprises a first insulator layer forming a first edge and a second edge of the flexible interconnect circuit. The flexible interconnect circuit also comprises a second insulator layer, stacked together with the first insulator layer. The flexible interconnect circuit comprises an interconnecting conductive layer comprising a first external terminal, a first conductive island, positioned proximate to the first edge, and a second conductive island, positioned proximate to the second edge. Each of the first conductive island and the second conductive island is at least partially positioned between the first insulator layer and the second insulator layer and is used for forming direct mechanical and electrical connections to at least a portion of the batteries. The first conductive island is electrically coupled to the first external terminal, positioned proximate to the first edge. The flexible interconnect circuit comprises a return conductive layer comprising one or more bus bars and a second external terminal. Each of the one or more bus bars extends between the first edge and the second edge. Furthermore, each of the one or more bus bars is electrically coupled to the second conductive island forming a return connection, positioned proximate to the second edge. Each of the one or more bus bars is electrically coupled to the second external terminal, positioned proximate to the first edge.

In some examples, the flexible interconnect circuit comprises a third insulator layer. The return conductive layer is at least partially positioned between the second insulator layer and the third insulator layer. The second insulator layer is at least partially positioned between the return conductive layer and the interconnecting conductive layer and electrically insulates the return conductive layer and the interconnecting conductive layer away from the return connection. In some examples, each of the one or more bus bars and the second conductive island extends past an edge of the second insulator layer to directly interface with each other and form the return connection. In some examples, the first insulator layer and the third insulator layer are sealed against each other forming the second edge. In some examples, the second insulator layer comprises a return-connection opening such that a portion of the one or more bus bars extends through the return-connection opening forming the return connection. The second insulator is sealed against each of the first insulator layer and the third insulator layer thereby collectively forming the second edge. In some examples, each of the first conductive island and the second conductive island comprises contact-forming portions for forming electrical connections with the batteries. Each of the first insulator layer, the second insulator layer, and the third insulator layer comprises insulator openings aligned with the contact-forming portions. Neither one of the one or more bus bars overlaps with the insulator openings.

In some examples, the return conductive layer is positioned between the first insulator layer and the second insulator layer. A portion of the flexible interconnect circuit, comprising the return conductive layer, is configured to bend relative to a portion of the flexible interconnect circuit, comprising the interconnecting conductive layer, to an angle if at least 90°.

In some examples, the flexible interconnect circuit further comprises one or more of additional conductive islands positioned between the first conductive island and the second conductive island. In some examples, the one or more bus bars and the second external terminal are all monolithic. In some examples, the first external terminal and the first conductive island are monolithic.

In some examples, a flexible interconnect circuit comprises a first insulator layer, a second insulator layer, a conductive layer comprising a contact-forming portion configured to form an external connection, and an additional conductive layer stacked with and directly interfacing the conductive layer. Both the conductive layer and the additional conductive layer are at least partially positioned between the first insulator layer and the second insulator layer. The contact-forming portion extends past a boundary of the first insulator layer and the second insulator layer. The conductive layer and additional conductive layer are interconnected using a multi-layered connection feature formed by a weld. In some examples, the multi-layered connection feature protrudes through the contact-forming portion of the conductive layer.

In some examples, the flexible interconnect circuit is part of a battery pack comprising a battery cell, which comprises a battery terminal. The multi-layered connection feature is part of an external connection feature interconnecting the contact-forming portion of the flexible interconnect circuit and the battery terminal. In some examples, the battery cell is a prismatic battery cell.

In some examples, the thickness of the conductive layer is the same as the thickness of the additional conductive layer. In the same or other examples, the conductive layer and the additional conductive layer have the same material composition.

In some examples, the thickness of the conductive layer is less than the thickness of the additional conductive layer. For example, the thickness of the conductive layer is at least three times less than the thickness of the additional conductive layer. In some examples, the multi-layered connection feature is positioned away from the contact-forming portion of the conductive layer. For example, the flexible interconnect circuit is part of a battery pack comprising a battery cell, which comprises a battery terminal. The multi-layered connection feature is separate from an external connection feature interconnecting the contact-forming portion of the flexible interconnect circuit and the battery terminal.

In some examples, a flexible interconnect circuit comprises a first insulator layer, and a second insulator layer, forming a stack with the first insulator layer. The stack comprises a first circuit portion, a second circuit portion, and a middle portion, positioned between the first circuit portion and the second circuit portion along a circuit axis. The stack comprises multiple slits within the middle portion and extends at least in part non-parallel to the circuit axis. The multiple slits enable the middle portion to change length thereby changing the space between the first circuit portion and the second circuit portion. The flexible interconnect circuit comprises conductive components positioned between the first insulator layer and the second insulator layer.

In some examples, at least one of the conductive components extends between two adjacent ones of the multiple slits. In the same or other examples, each of the multiple slits has a width of less than 1 millimeter. In some examples, the multiple slits have a chevron shape.

In some examples, a method of fabricating a flexible interconnect circuit comprising a set of current controlling slits is provided. The method comprises receiving a conductive layer design corresponding to a conductive layer of the flexible interconnect circuit. The conductive layer design comprises design-contact-forming portions corresponding to contact-forming portions of the conductive layer. The method comprises determining a resistive heating map for the conductive layer based on an electric current map comprising target current values. Each of the target current values corresponds to one of the design-contact-forming portions and represents a maximum current to be flowed through a corresponding one of the contact-forming portions. The resistive heating map comprises heating rate values for different points in the conductive layer design. When any of the heating rate values in the resistive heating map falls outside of resistive-heating-map limits, the method proceeds with updating a design set of current controlling slits in the conductive layer design and determining the resistive heating map using the conductive layer design with the design set of current controlling slits until all of the heating rate values in the resistive heating map are within the resistive-heating-map limits.

In some examples, each slit in the design set of current controlling slits has a width (W) of less than 1 millimeter. In the same or other examples, each slit in the design set of current controlling slits has an aspect ratio of a slit width (W) to a slit depth (D) of less than 10. In some examples, at least one slit in the design set of current controlling slits is a through slit forming a full separation between two portions of the conductive layer design.

In some examples, at least one slit in the design set of current controlling slits is a partial slit providing only a partial separation between two portions of the conductive layer design and maintaining a part monolithic contact between the two portions. In more specific examples, the partial slit has a ratio of a slit depth (D) to a conductive layer thickness (T) of greater than 0.5. In some examples, the design set of current controlling slits in the conductive layer design is updated to provide resistances between set pairs of the contact-forming portions within resistance limits.

In some examples, determining the resistive heating map for the conductive layer comprises accounting for environmental heat losses by the conductive layer. For example, the conductive layer at least partially overlaps with and adheres to a first insulator layer. In more specific examples, at least one slit in the set of current controlling slits at least partially overlaps with the first insulator layer. In some examples, the conductive layer at least partially extends between the first insulator layer and a second insulator layer.

In some examples, the resistive-heating-map limits comprise multiple different current density values for different portions of the conductive layer design. In the same or other examples, the resistive-heating-map limits comprise multiple different heating rate values for different portions of the conductive layer design. In some examples, the multiple different heating rate values of the resistive-heating-map limits are determined from current densities in the different portions of the conductive layer design.

In some examples, updating the design set of current controlling slits in the conductive layer design is performed until the current densities in the different portions of the conductive layer design are within current density limits.

In some examples, determining the resistive heating map is performed using computer modeling. In some examples, the method further comprises patterning the conductive layer in accordance with the conductive layer design comprising the design set of current controlling slits, wherein patterning the conductive layer comprises forming the set of current controlling slits corresponding to the design set of current controlling slits.

In some examples, the conductive layer is formed from aluminum. In some examples, the conductive layer has a thickness of at least 100 micrometers. The flexible interconnect circuit may be configured for interconnecting batteries.

In some examples, a flexible interconnect circuit for interconnecting a set of batteries is provided such that the flexible interconnect circuit comprises a first insulator layer comprising a main portion, a first flap, and a second flap. The main portion is positioned between and is monolithic with each of the first flap and the second flap. The flexible interconnect circuit comprises conductive components supported by the main portion of the first insulator layer. flexible interconnect circuit also comprises straps comprising a first strap and a second strap. The first strap is supported by the first flap such ends of the first strap extend past the first flap. The second strap is supported by the second flap such ends of the second strap extend past the second flap. The straps are configured to support the set of batteries and support the flexible interconnect circuit relative to the set of batteries.

In some examples, the straps are configured to interconnect while encircling and supporting the set of batteries and supporting the flexible interconnect circuit relative to the set of batteries. For example, each of the first strap and the second strap has a length greater than half of the perimeter of the set of batteries.

In some examples, the first insulator layer comprises insulator openings partially exposing each of the conductive components. In the same or other examples, the first insulator layer comprises insulator openings positioned on the first flap and the second flap and away from the conductive components.

In some examples, at least one of the first flap and the second flap support voltage traces connected to the conductive components. In some examples, each of the first flap and the second flap defines an entire side of the main portion. Alternatively, each of the first flap and the second flap may define a corner part of an entire side of the main portion.

In some examples, the flexible interconnect circuit further comprises a second insulator layer such that the conductive components at least partially extend between a stack formed by the first insulator layer and the second insulator layer. In the same or other examples, the first insulator layer further comprises a third flap and a fourth flap, wherein the main portion is positioned between and is monolithic with each of the third flap and the fourth flap. In more specific examples, the straps comprise a third strap and a fourth strap. The third strap is supported by the third flap. The fourth strap is supported by the fourth flap. The third strap is configured to interconnect with each of the first strap and the second strap. The fourth strap is configured to interconnect with each of the first strap and the second strap. In some examples, the straps are formed from aluminum.

BRIEF DESCRIPTION OF THE DRAWINGS

FIG. 4C is a schematic top view of various conductive components of a flexible interconnect circuit, in accordance with some examples.

FIG. 4D is a schematic expanded view of the power traces and power circuit element of one power conductive component in FIG. 4C, in accordance with some examples.

FIG. 4E is a schematic expanded view of the signal traces and signal circuit element of one signal conductive component in FIG. 4C, in accordance with some examples.

FIGS. 5A-5C are electrical schematics corresponding to a flexible interconnect circuit, an interconnecting conductive layer of the flexible interconnect circuit, and a return conductive layer of the flexible interconnect circuit, in accordance with some examples.

FIGS. 6A and 6B are schematic side cross-sectional views of two examples of a flexible interconnect circuit comprising an interconnecting conductive layer and a return conductive layer that are stacked, in accordance with some examples.

FIGS. 7A-7K are schematic top views of batteries and various components of a flexible interconnect circuit used to interconnect these batteries, in accordance with some examples.

FIGS. 16A-16E are different components of a flexible interconnect circuit and different stages of forming this flexible interconnect circuit, in accordance with some examples.

DETAILED DESCRIPTION

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with specific examples, it will be understood that these examples are not intended to be limiting.

Flexible interconnect circuits are used to deliver power and/or signals and are used for various applications, such as vehicles, appliances, electronics, and the like. One example of such flexible interconnect circuits is a harness. As noted above, a conventional harness uses a stranded set of small round wires. A separate polymer shell insulates each wire, adding to the size and weight of the harness. Unlike conventional harnesses, flexible interconnect circuits described herein have thin flat profiles, enabled by thin electrical conductors that can be positioned side-by-side. Each electrical conductor can have a flat rectangular profile. In some examples, electrical conductors (positioned next to each other) are formed from the same metal sheet (e.g., foil). For purposes of this disclosure, the term "interconnect" is used interchangeably with "flexible interconnect circuit", the term "conductive layer"—with "conductor" or "conductor layer", and the term "insulating layer"—with "insulator".

Examples of Flexible Interconnect Circuit Assemblies

Figure 1A:
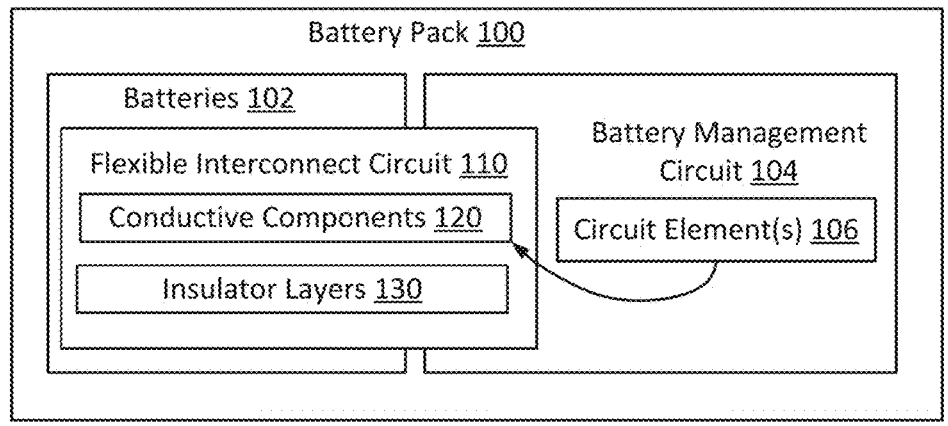
FIG. 1A is a block diagram of a battery pack comprising a flexible interconnect circuit and external circuit elements, forming post-fabrication connections with the conductive components of the flexible interconnect circuit, in accordance with some examples.

Electrical assemblies, such as battery packs, are typically formed by fabricating individual components and then interconnecting these components into the assemblies. For example, an assembly may include various circuit elements (e.g., resistors) and a flexible interconnect circuit. The flexible interconnect circuit and circuit elements are fabricated independently and then connected, forming a final assembly. In some examples, circuit elements can be grouped into a subassembly (e.g., a battery management system in a battery pack), which is then corrected (as a group) to a flexible interconnect circuit as, e.g., is schematically shown in FIG. 1A. Specifically, FIG. 1A is a block diagram of battery pack 100 that comprises batteries 102, flexible interconnect circuit 110, and battery management circuit 104. Batteries 102 are interconnected by flexible interconnect circuit 110 or, more specifically, by conductive components 120 of flexible interconnect circuit 110. Flexible interconnect circuit 110 also comprises one or more insulator layers 130, which are used to support and at least partially insulate conductive components 120. Battery management circuit 104 comprises external circuit element 106, forming post-fabrication connections to conductive components 120 of flexible interconnect circuit 110. External circuit element 106 can be interconnected within battery management circuit 104 with battery management circuit 104 forming one primary connection to flexible interconnect circuit 110. In some examples, external circuit element 106 can form direct connections to conductive components 120 as further described below with reference to FIGS. 3A and 3B.

Figure 1B:
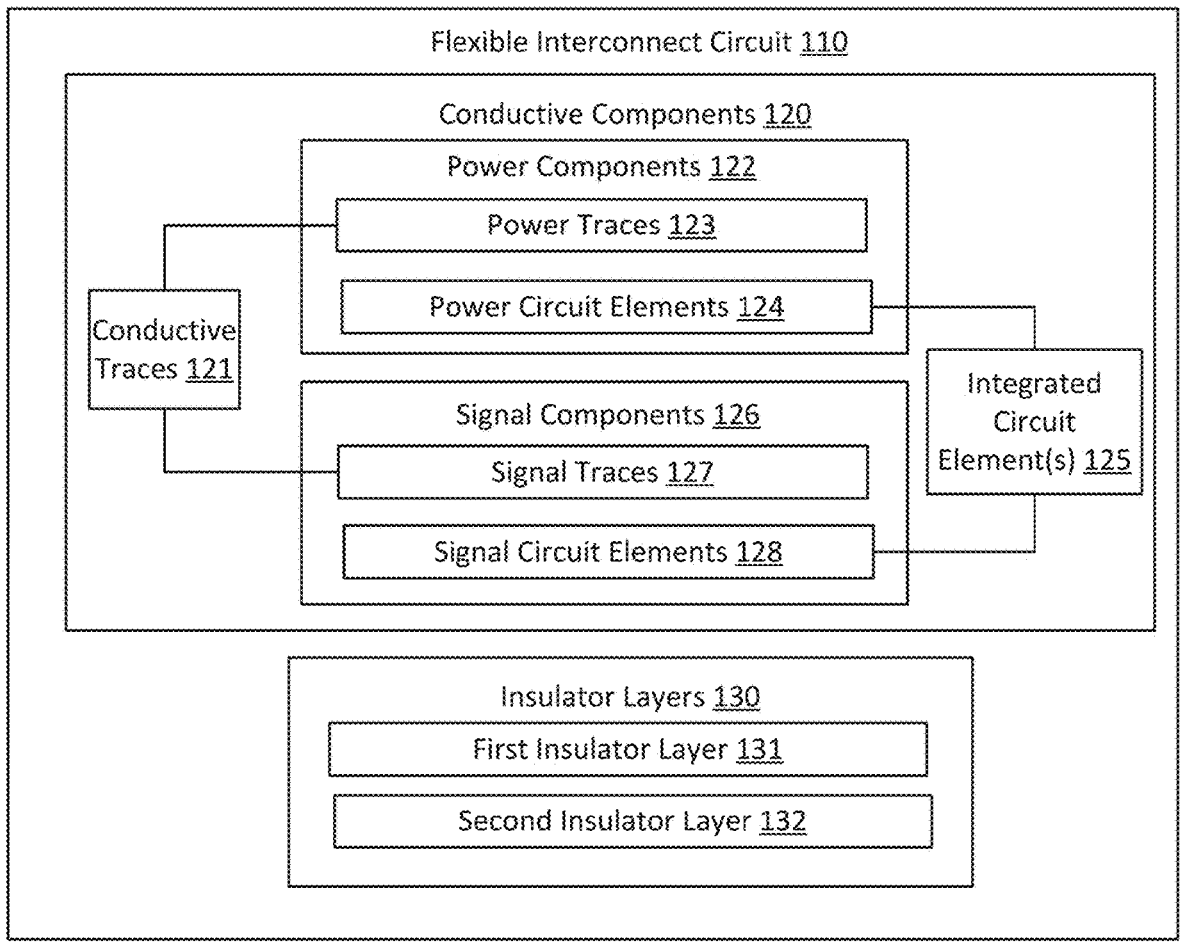
FIG. 1B is a block diagram of a battery pack in which circuit elements are integrated into conductive components of the flexible interconnect circuit, in accordance with some examples.

FIG. 1B is a block diagram of battery pack 100 comprising integrated circuit elements 125, which are defined as circuit elements that are integrated and, more specifically, monolithic with conductive components 120 of flexible interconnect circuit 110. More specifically, integrated circuit elements 125 are parts of conductive components 120 together with conductive traces 121. Conductive components 120 can also include other sub-components (besides integrated circuit elements 125 and conductive traces 121) such as contact pads.

To ensure the monolithic aspect, integrated circuit elements 125 are formed during the fabrication of flexible interconnect circuit 110 or, more specifically, during the fabrication of conductive components 120 together with conductive traces 121 (and other subcomponents, if any), which these integrated circuit elements 125 interconnect. For example, integrated circuit element 125 can have two instances of conductive traces 121, which are positioned at each end of integrated circuit element 125 and which are interconnected by this integrated circuit element 125. In more specific examples, integrated circuit elements 125 can be monolithic with conductive traces 121 (e.g., formed from the same metal sheet). This integration eliminates the need for post-fabrication connection operations and reduces the overall number of components. Alternatively, external circuit element 106 is fabricated independently from flexible interconnect circuit 110 and are connected to conductive components 120 in separate post-fabrication operations as further described below with reference to FIGS. 3A and 3B.

Referring to FIG. 1B, conductive components 120 can be conceptually divided into power components 122 and signal components 126. When both types of conductive components 120 are present within flexible interconnect circuit 110, power components 122 are configured to carry a significantly larger electric current than signal components 126, e.g., at least a twice large current, at least a 3× larger current, at least a 5× larger current, or even at least a 10× larger current. For example, power components 122 are capable of carrying electric currents of more than 30 Amps or, more specifically, more than 40 Amps or even more than 50 Amps (in some applications, like battery packs). In the same or other examples, signal components 126 are capable of carrying electric currents of less than 20 Amps or, more specifically, less than 15 Amps or even less than 10 Amps. Of course, one having ordinary skills in the art would understand that these current limits depend on the specific applications of flexible interconnect circuit 110 and could be different for different applications.

In some examples, power components 122 comprise power traces 123, which extend throughout flexible interconnect circuit 110 and carry the electrical power among parts of flexible interconnect circuit 110 or, more specifically, among different power components connected to flexible interconnect circuit 110. For example, power components 122 can be connected to batteries 102 in battery pack 100. In more specific examples, power components 122 comprise power circuit elements 124, such as balancing resistors and fusible links. Some examples of power circuit elements 124 are shown and described below with reference to FIGS. 4C and 4D.

In some examples, signal components 126 comprise signal traces 127, which extend throughout flexible interconnect circuit 110 and carry the electrical signal among parts of flexible interconnect circuit 110 or, more specifically, among different signal components connected to flexible interconnect circuit 110. For example, signal components 126 can be connected to power traces 123, sensors, control circuitry, and the like. In more specific examples, signal components 126 comprise signal circuit elements 128, such as balancing resistors, fusible links, capacitors, controllers, and the like. Unlike power circuit elements 124, signal circuit elements 128 are rated for much smaller electric currents as described above. In general, power traces 123 and signal traces 127 are examples of conductive traces 121, while power circuit elements 124 and signal circuit elements 128 are examples of integrated circuit elements 125.

In some examples, power components 122 and signal components 126 may have the same thickness (e.g., formed from the same metal sheet). Alternatively, power components 122 and signal components 126 may have different thicknesses and may be connected at some locations. In these examples, all power components 122 may have the same thickness, and, separately, all signal components 126 may have the same thickness.

In some examples, all conductive components 120 are formed from the same material, e.g., aluminum, copper, or the like. The use of aluminum (instead of copper) may help with lowering the overall circuit weight and also with lowering the minimum achievable fuse current rating. Specifically, aluminum has a higher resistivity and lower melting temperature than copper. As such, forming fusible links in an aluminum conductive layer may allow for more precise control of the fusible parameters (for the same size tolerance). In general, conductive components 120 may be formed from any conductive material that is sufficiently conductive (e.g., a conductivity being greater than $10^6$ S/m or even greater than $10^7$ S/m to allow for current flow through the foil with low power loss.

In some examples, conductive components 120 may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers, which may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold-welded, or applied via other means. In some examples, the thickness of the surface sublayer may range from 0.05 micrometers to 10 micrometers or, more specifically, from 0.1 micrometers to 2.5 micrometers. Furthermore, in some examples, the addition of a coating of the OSP on top of the surface sublayer may help prevent the surface sublayer itself from oxidizing over time. The surface sublayer may be used when a base sublayer of conductive traces 150 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum-containing base layer.

Referring to FIG. 1B, flexible interconnect circuit 110 also comprises insulator layers 130, such as first insulator layer 131 and second insulator layer 132, that support and insulate various instances of conductive components 120. For example, insulator layers 130 maintain spacing between conductive components 120. Furthermore, insulator layers 130 can include various features for forming electrical connections to conductive components 120 and ensure the functionality of conductive components 120. First insulator layer 131 and/or second insulator layer 132 may include (or formed from) polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB).

Figure 2A:
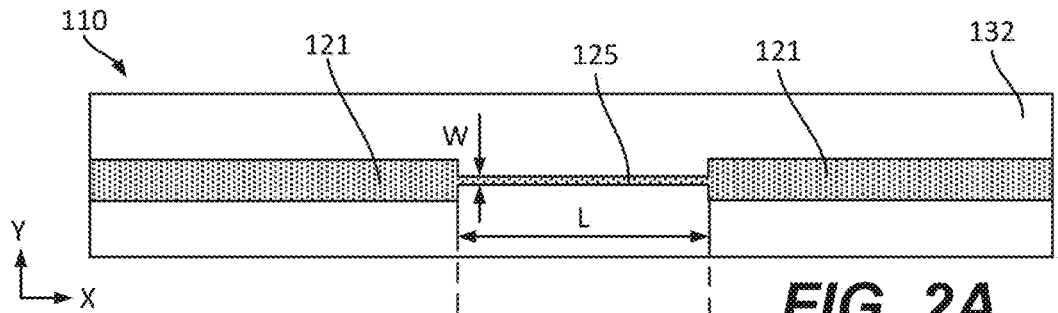
FIG. 2A is a schematic top cross-sectional view of an integrated circuit element that is monolithic with the signal traces interconnected by this integrated circuit element, in accordance with some examples.

Various features of integrated circuit elements 125 will now be described with reference to FIGS. 2A-2F. As noted above, integrated circuit elements 125 (e.g., power circuit elements 124 and signal circuit elements 128) are integrated directly into conductive components 120 without any need for additional connections. FIG. 2A is a schematic top view of flexible interconnect circuit 110 in which integrated circuit element 125 is monolithic with conductive traces 121, in accordance with some examples. For example, integrated circuit element 125 and conductive traces 121 can be patterned from the same metal sheet (e.g., foil) without a need for separate connections between these components. Not only this integration reduces the number of required connections, but it also reduces the need for external components. integrated circuit element 125 can be formed in situ while fabricating the circuit.

Figure 2B:
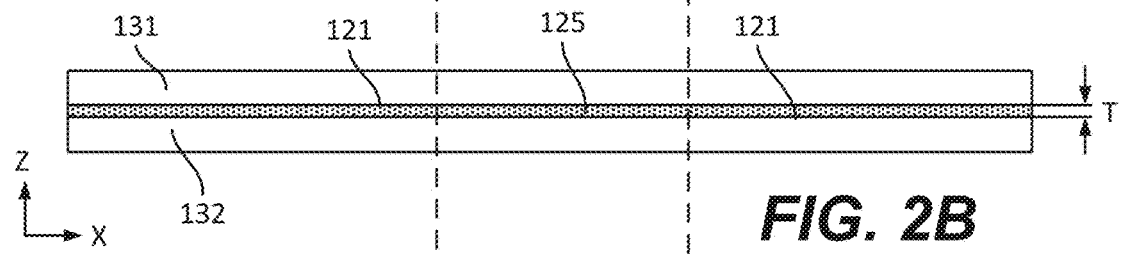
FIGS. 2B-2D are schematic side cross-sectional views of an integrated circuit element that is monolithic with the signal traces interconnected by this integrated circuit element, in accordance with some examples.
Figure 2C:
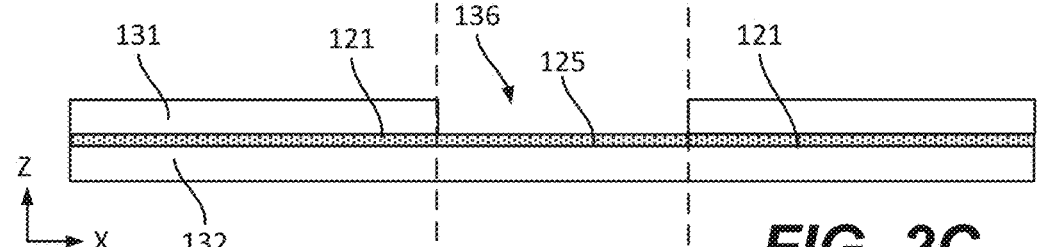
Figure 2D:
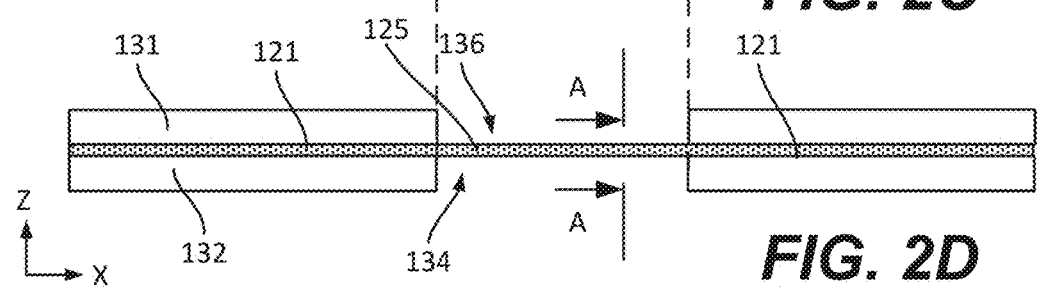

Referring to FIGS. 2B-2D, first insulator layer 131 and second insulator layer 132 are used for supporting various conductive components of flexible interconnect circuit 110. While FIGS. 2B-2D illustrates only one conductive component formed by integrated circuit element 125 and conductive traces 121, one having ordinary skills in the art would understand that this conductive component can be positioned adjacent to other components without being connected to these other components. In some examples, integrated circuit element 125 overlaps with both first insulator layer 131 and second insulator layer 132 as, e.g., is schematically shown in FIG. 2B. Alternatively, integrated circuit element 125 overlaps with only one insulator layer (e.g., second insulator layer 132) as, e.g., is schematically shown in FIG. 2C. This overlap may be used to provide support to integrated circuit element 125, which can have a substantially smaller cross-sectional area than conductive traces 121. Finally, in some examples, integrated circuit element 125 does not overlap with either one insulator layer, e.g., is schematically shown in FIG. 2D. For example, integrated circuit element 125 can be used as a fuse, which requires special thermal characteristics to activate (e.g., environmental heat dissipation).

Different sizes of integrated circuit element 125 are within the scope. These sizes depend on the application of integrated circuit element 125 (e.g., power circuit elements 124 and signal circuit elements 128), the type of integrated circuit element 125 (e.g., a fusible link, balancing resistor), and the material used for integrated circuit element 125 (e.g., copper, aluminum). In some examples, the thickness of integrated circuit element 125 (e.g., signal circuit element 128) is between 70 micrometers and 500 micrometers or, more specifically, between 100 micrometers and 250 micrometers or even more specifically, between 100 micrometers and 125 micrometers. It should be noted that the thickness of conductive traces 121 can be the same as integrated circuit element 125 as, e.g., is schematically shown in FIGS. 2B-2D. It should be also noted that many conventional pattern techniques (e.g., etching) are not capable of processing metal foil having such large thicknesses (e.g., greater than 100 micrometers). In some examples, integrated circuit element 125 is a fuse with a fusible current rating of between 6 Amps and 20 Amps or, more specifically, between 8 Amps and 12 Amps (e.g., when integrated circuit element 125 is signal circuit element 128). These fusible current ratings can be achieved with integrated circuit element 125 made from aluminum that has a thickness of 50-150 micrometers or, more specifically, 100-125 micrometers.

Figure 2E:
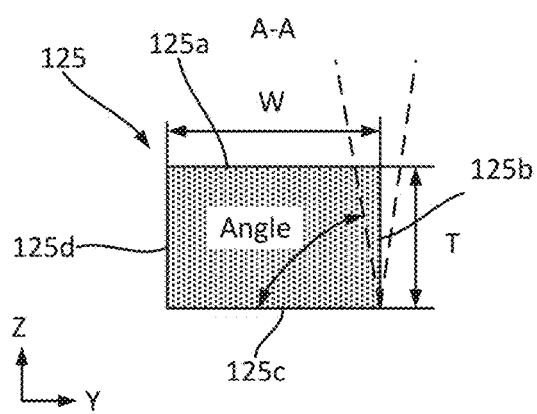
FIGS. 2E-2G are schematic front cross-sectional views of an integrated circuit element, in accordance with some examples.
Figure 2F:
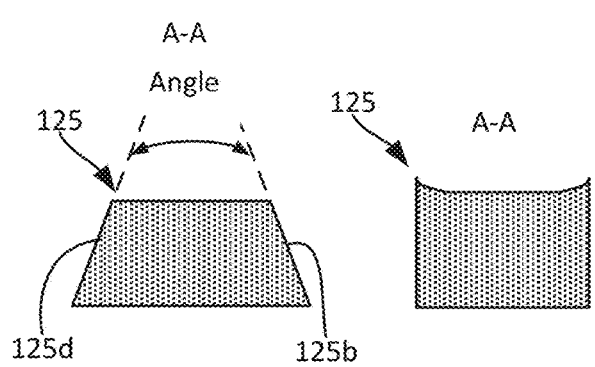
Figure 2G:
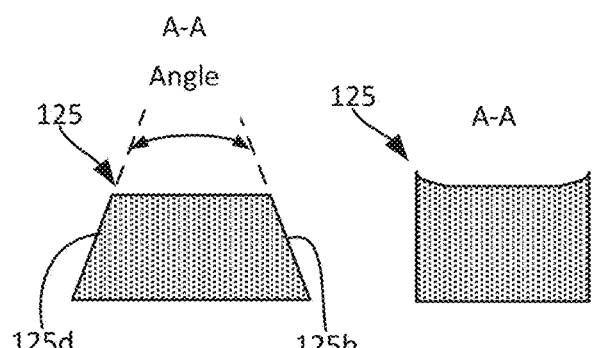

Referring to FIGS. 2E-2G, integrated circuit element 125 can have a substantially rectangular cross-section. The "substantially rectangular" includes various deviations (e.g., angles of sidewalls) as further described below. Specifically, FIG. 2E illustrates integrated circuit element 125 having four sides, i.e., first side 125*a*, second side 125*b*, third side 125*c*, and fourth side 125*d*. When integrated circuit element 125 is formed by patterning a metal foil/sheet, first side 125*a* and third side 125*c* (which may be referred to as top and bottom sides) are original to this metal foil/sheet, while second side 125*b* and fourth side 125*d* (which may be referred to as sidewalls) are formed during patterning. It should be noted that for purposes of this disclosure, the terms "top" and "bottom" do not refer to any spatial orientations of integrated circuit element 125 but merely to differentiate the two sides. As such, first side 125*a* and third side 125*c* are parallel to each other (e.g., within 5° or even within 2°). On the other hand, the angle between first side 125*a* and second side 125*b* can vary between 45° and 135° or, more specifically, between 60° and 120° or even between 80° and 100°. Referring to FIG. 2F, in some examples, the angle between second side 125*b* and fourth side 125*d* is less than 180°, less than 160°, or even less than 140°, e.g., between 120-180° or between 130-170°. In other words, second side 125*b* and fourth side 125*d* are not parallel. When first side 125*a* is a processing side, which is defined as the side from which the patterning is performed, the angle between first side 125*a* and second side 125*b* can vary between 90° and 135° or, more specifically, between 90° and 120° or even between 90° and 100°. In other words and with reference to FIG. 2F, first side 125*a* can be narrower than third side 125*c*, which is positioned against some support substrate during patterning. It should be noted that the profile or at least the angles between different sides can be the same for integrated circuit elements 125 and conductive traces 121, which can be formed in the same patterning operation. Furthermore, in some examples and referring to FIG. 2G, edges between the sidewalls (i.e., second side 125*b* and fourth side 125*d* can protrude past first side 125*a* or, more specifically, the majority of the first side 125*a* thereby creating burr-like structures at these edges. The presence, shape, size, and other characteristics of various features (which are shown in FIGS. 2E-2G) depend on the methods of forming integrated circuit element 125 or, more generally, conductive components 120.

Figure 3A:
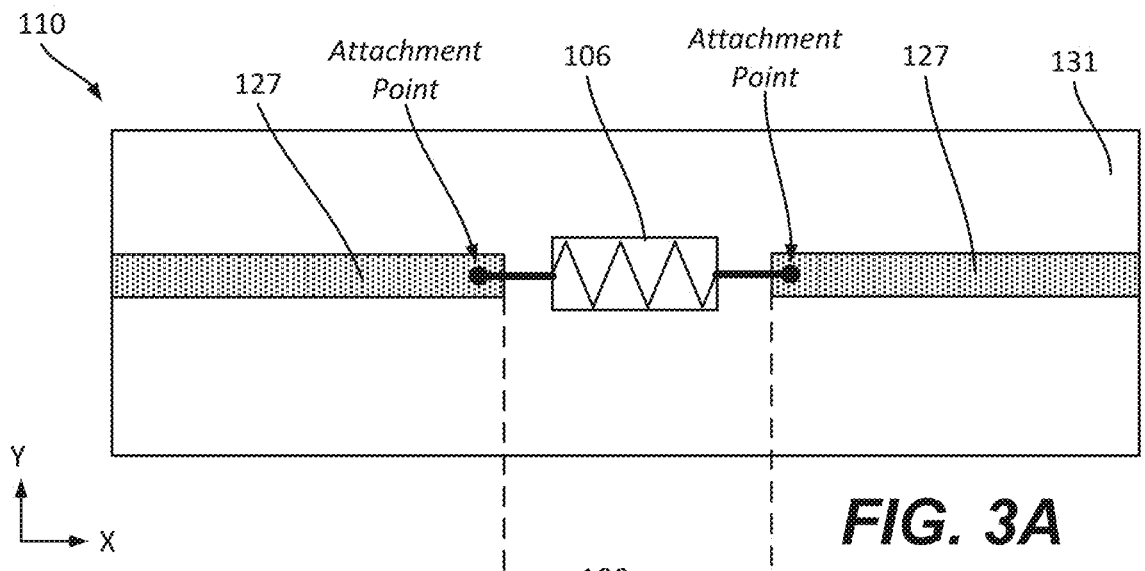
FIGS. 3A and 3B are schematic top and side views of an external circuit element forming a post-fabrication connection to signal traces, in accordance with some examples.
Figure 3B:
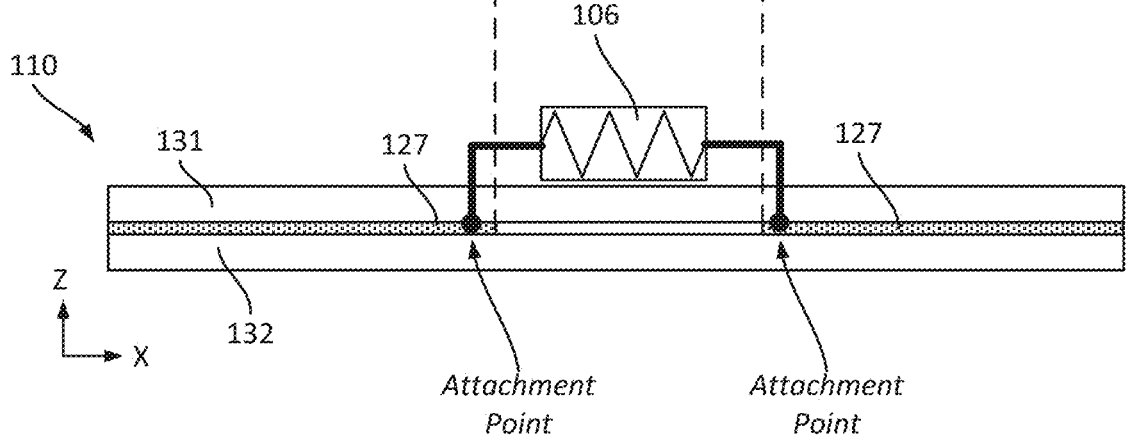

FIGS. 3A and 3B illustrate a conventional approach for connecting external circuit element 106 to flexible interconnect circuit 110. In these examples, flexible interconnect circuit 110 two signal traces 127, which are disconnected during the fabrication of flexible interconnect circuit 110. Signal traces 127 are then connected by attaching external circuit element 106 to flexible interconnect circuit 110. In comparison to integrated circuit element 125 described above with references to FIGS. 2A-2D, this external mounted design requires two attachment points to form electrical connections between external circuit element 106 and each of two signal traces 127. Furthermore, external circuit element 106 protrudes above flexible interconnect circuit 110 as shown in FIG. 3B. For example, external circuit element 106 can extend above first insulator layer 131.

In some examples, integrated circuit element 125 is signal circuit element 128. Flexible interconnect circuit 110 can comprise first insulator layer 131, second insulator layer 132, and signal trace 127 at least partially extending between first insulator layer 131 and second insulator layer 132. Flexible interconnect circuit 110 can also comprise signal circuit element 128, which has a thickness of at least 100 micrometers. Signal circuit element 128 can be positioned between first insulator layer 131 and second insulator layer 132, be in contact with only one of first insulator layer 131 and second insulator layer 132, or positioned away from first insulator layer 131 and second insulator layer 132. For example, first insulator layer 131 can comprise first insulator opening 136, with which signal circuit element 128 overlaps as, e.g., is shown in FIGS. 2C and 2D. In the same or other examples, second insulator layer 132 can comprise second insulator opening 134, with which signal circuit element 128 overlaps as, e.g., is shown in FIG. 2D.

Referring to FIGS. 2A and 2B, in some examples, the thickness of signal trace 127 is the same as the thickness of signal circuit element 128. In the same or other examples, the width of signal trace 127 is less than the thickness of signal circuit element 128. Signal trace 127 extends over a straight line and has a constant cross-section.

Figure 4A:
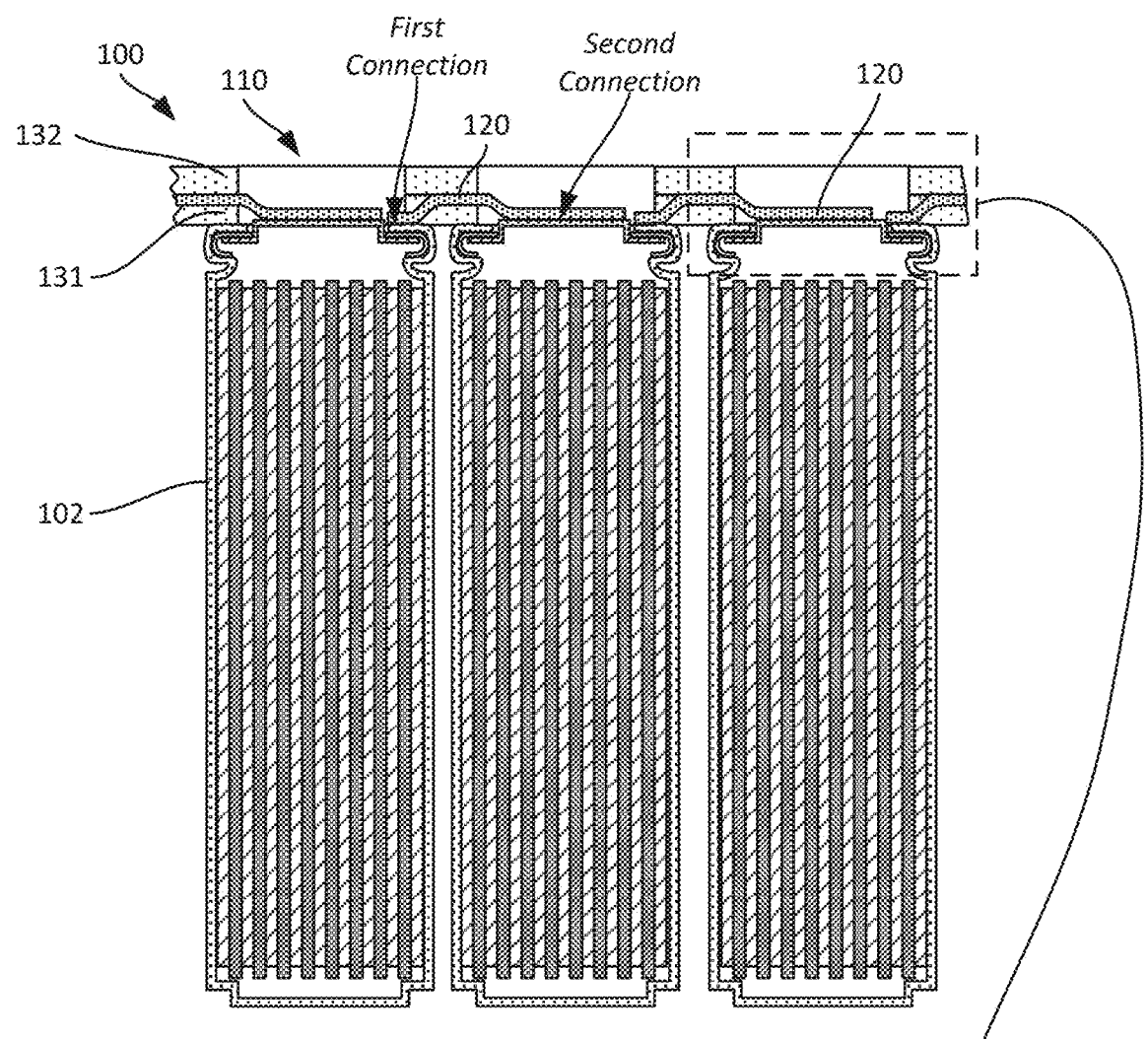
FIG. 4A is a schematic side cross-sectional view of a battery pack comprising batteries interconnected using the conductive components of a flexible interconnect circuit, in accordance with some examples.
Figure 4B:
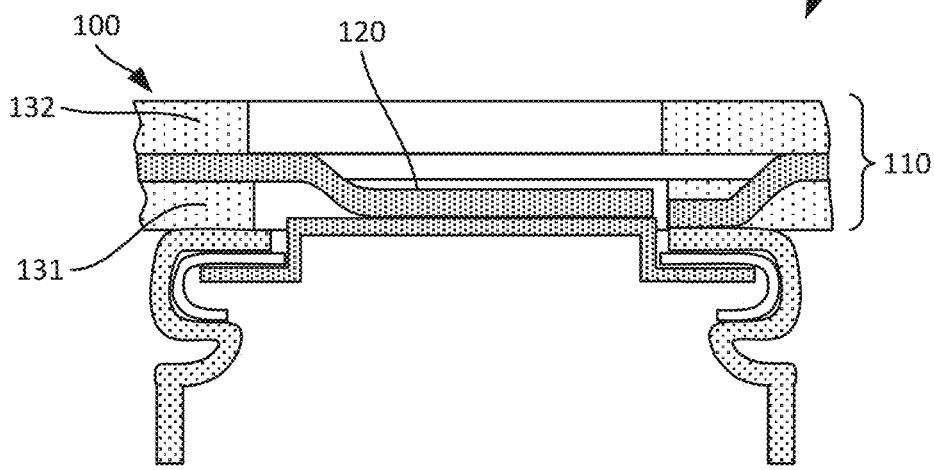
FIG. 4B is a schematic expanded view of one battery in FIG. 4A that is connected to the conductive component of a flexible interconnect circuit, in accordance with some examples.

A specific application of flexible interconnect circuit 110 will now be described with reference to FIGS. 4A-4E. FIG. 4A is a schematic side cross-sectional view of battery pack 100 that comprises batteries 102 interconnected using conductive components 120 of flexible interconnect circuit 110, in accordance with some examples. Specifically, FIG. 4A illustrates one example of conductive components 120 forming a first connection to the edge terminal (e.g., the can) of one battery and also forming a second connection to the center terminal (e.g., the lid) of another battery thereby forming an in-series connection between these batteries. Conductive components 120 of are supported by first insulator layer 131 and second insulator layer 132 as, e.g., more clearly shown in FIG. 4B, which a schematic expanded view of one battery in FIG. 4A.

The connections formed by conductive components 120 depend on the design of these conductive components 120. One example of conductive components 120 is shown in FIG. 4C, illustrating power components 122 and signal components 126. Specifically, power components 122 comprise power traces 123 and power circuit elements 124. In this example/view, power traces 123 and power circuit elements 124 are arranged into three different islands. It should be noted that this view represents only a part of the overall flexible interconnect circuit. Referring to the middle island, power traces 123 are designed to form connections to the battery terminals and carry current between these battery terminals. Some examples of power traces 123 are interconnected (within the same island) with power circuit elements 124, which are operable as fusible links in this example. Specifically, FIG. 4D is a schematic expanded view of two instances of power traces 123 and power circuit elements 124 connecting these two power traces. The width (W0) of power circuit elements 124 is specifically controlled to achieve various fusible characteristics (e.g., a fusible current of between 30 Amps and 70 Amps or, more specifically, between 40 Amps and 60 Amps). In some examples, power traces 123 are monolithic with power circuit elements 124 that these power trace 123 interconnect. For example, the average width of power trace 124 can be at least 10 times greater than the average width of signal trace 127 or even at least 20 times greater thereby allowing larger currents to pass through power trace 124 than through signal trace 127.

FIG. 4E is a schematic expanded view of one example of signal components 126 that comprises signal traces 128 and signal circuit element 128. Similar to power circuit elements 124, signal circuit element 128 interconnects the corresponding signal traces 127 and can be monolithic with these signal traces 127. The width (W0) of signal circuit element 128 is specifically controlled to achieve various fusible characteristics (e.g., a fusible current of between 6 Amps and 15 Amps or, more specifically, between 8 Amps and 12 Amps). In some examples, a signal component can be monolithic with corresponding one of power components 122 as, e.g., is schematically shown in FIG. 4C. In these examples, signal components 126 and power components 122 are formed from the same materials and have the same thickness (e.g., patterned from the same metal foil). Alternatively, a signal component is connected with corresponding one of power components 122 (e.g., using welding, soldering) and can be formed from different materials and/or have different thicknesses. For example, signal components 126 can be much thinner than power components 122. Reducing the thickness of signal components 126 can allow more precise control of various characteristics of signal circuit elements 128. For example, many of these characteristics depend on the cross-sectional area of signal circuit elements 128. The thickness of signal circuit elements 128 can be well controlled due to the starting material (e.g., metal foil). The width is controlled by the patterning technique and may be more difficult to achieve.

Return Bus Bars in Flexible Interconnect Circuits

Battery pack designs often require the external connection terminals to be positioned on the same side of a battery pack (e.g., to form all electrical connections to this pack on one side). When a battery pack has multiple battery cells, a return bus bar is needed to achieve this same side design. Conventional return bus bars are separate structures. For example, a return bus bar can be positioned over and isolated from an interconnecting bus bar. This approach requires multiple components and additional fabrication steps (e.g., aligning return and interconnecting bus bars, forming edge connections between these two bus bars), and can result in a bulky/heavy assembly.

Described herein is flexible interconnect circuit 110 with interconnecting conductive layer 140 and return conductive layer 150, both integrated into flexible interconnect circuit 110. Flexible interconnect circuit 110 comprises first external terminal 145 and second external terminal 155 on the same side of flexible interconnect circuit 110 (e.g., proximate to first edge 118 of flexible interconnect circuit 110). For example, first external terminal 145 can be a part of interconnecting conductive layer 140 while second external terminal 155 can be a part of return conductive layer 150.

FIG. 5A is an electrical schematic corresponding to flexible interconnect circuit 110 showing various connections (identified as circles) to batteries 102. While only six batteries are shown, one having ordinary skills in the art would understand that any number of batteries are within the scope. Furthermore, while FIG. 5A illustrates a 3P2S connection (i.e., 3 batteries with parallel connections forming a group, and two separate groups interconnected in series), other types of connections are also within the scope.

As shown in FIG. 5A, flexible interconnect circuit 110 comprises interconnecting conductive layer 140 and return conductive layer 150. Interconnecting conductive layer 140 forms connections to batteries 102 and is also connected to return conductive layer 150. In this example (as well as FIG. 6A), interconnecting conductive layer 140 is connected directly to return conductive layer 150. Alternatively, as shown in FIG. 6B, interconnecting conductive layer 140 is connected to return conductive layer 150 through the last row of batteries 102 (i.e., interconnecting conductive layer 140 is connected to one terminal of each of these batteries, while return conductive layer 150 is connected to another terminal). In either case, this connection is referred to as return connection 129.

FIG. 5B is an electrical schematic corresponding to interconnecting conductive layer 140 (alone) to better illustrates various features of interconnecting conductive layer 140. Interconnecting conductive layer 140 comprises first external terminal 145 and first conductive island 141. First conductive island 141 is positioned proximate to first edge 118 and is electrically coupled to first external terminal 145, positioned proximate to first edge 118. In some examples, first conductive island 141 is monolithic with first external terminal 145. First conductive island 141 interconnects one group of battery cells, e.g., forming electrical connections to one of their battery terminals.

In some examples (e.g., shown in FIGS. 5A, 5B, and 6A), interconnecting conductive layer 140 also comprises second conductive island 142 that is positioned proximate to second edge 119. Second conductive island 142 interconnects another group of battery cells, e.g., forming electrical connections to one of their battery terminals. Second conductive island 142, when present, also forms return connection 129 with return conductive layer 150 as, e.g., is schematically shown in FIG. 6A.

In some examples, interconnecting conductive layer 140 comprises one or more additional conductive islands 143, which may be also referred to as intermediate conductive islands. Unlike first conductive island 141 and second conductive island 142, which are each connected to only one group of cells, each intermediate conductive island is connected to two groups of cells, forming parallel connections in each group and interconnecting these two groups in series.

In some examples, interconnecting conductive layer 140 has no intermediate conductive islands or the number of intermediate conductive islands can be one, two, or more. Overall, while FIG. 5B illustrates three conductive islands, any number of conductive islands are within the scope, e.g., one, two, three, four, five, or more.

FIG. 5C is an electrical schematic corresponding to return conductive layer 150 comprising one or more bus bars 152 and a second external terminal 155. Each of one or more bus bars 152 extends between first edge 118 and second edge 119. When second conductive island 142 is present, each of one or more bus bars 152 is electrically coupled to second conductive island 142 forming return connection 129, positioned proximate to second edge 119 as, e.g., is schematically shown in FIGS. 5A-5C and 6A. Alternatively, when second conductive island 142 is not present, one or more bus bars 152 is electrically coupled directly to the last battery group as, e.g., is schematically shown in FIGS. 5A-5C and 6A. In either case, each of one or more bus bars 152 is electrically coupled to second external terminal 155, positioned proximate to first edge 118. In some examples, each of one or more bus bars 152 is monolithic with second external terminal 155.

Figure 8A:
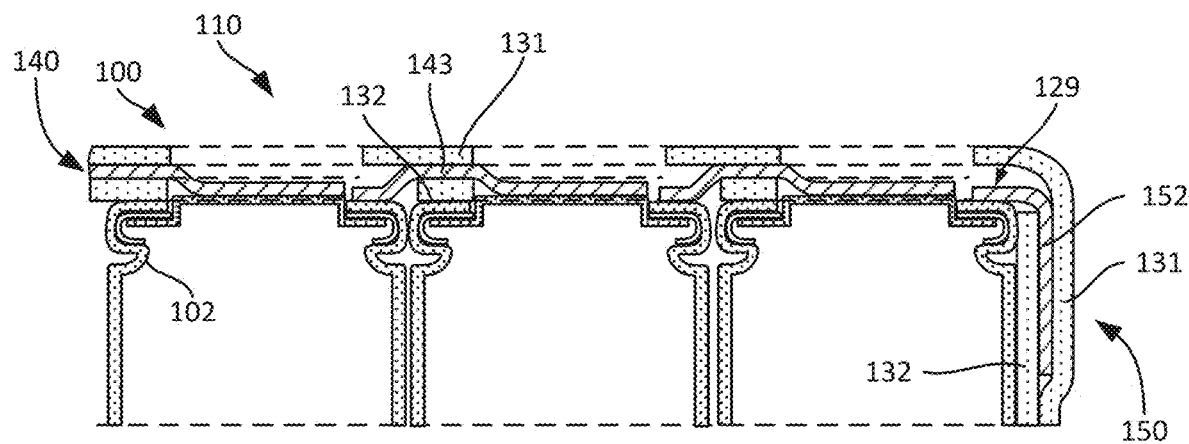
FIGS. 8A and 8B are a schematic side cross-sectional view and a schematic top view of a flexible interconnect circuit comprising an interconnecting conductive layer and a return conductive layer that are positioned side-by-side, in accordance with some examples.
Figure 8B:
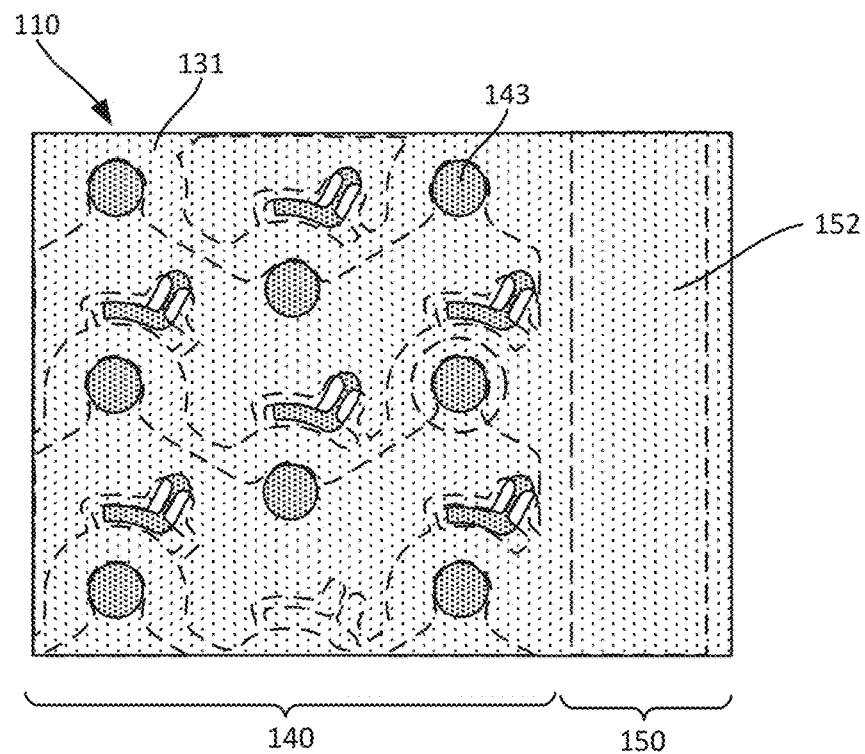

FIGS. 6A and 6B are are schematic side cross-sectional views of flexible interconnect circuit 110 comprising interconnecting conductive layer 140 and return conductive layer 150 that are stacked, in accordance with some examples. Alternatively, interconnecting conductive layer 140 and return conductive layer 150 are positioned side-by-side as shown in FIGS. 8A and 8B and described below. In both examples, flexible interconnect circuit 110 comprises first insulator layer 131 forming first edge 118 and second edge 119 of flexible interconnect circuit 110. Flexible interconnect circuit 110 also comprises second insulator layer 132, stacked together with first insulator layer 131. Any conductive layers of interconnecting conductive layer 140 (e.g., first conductive island 141 and second conductive island 142) are at least partially positioned between first insulator layer 131 and second insulator layer 132.

When interconnecting conductive layer 140 and return conductive layer 150 are stacked, flexible interconnect circuit 110 also comprises third insulator layer 133 such that return conductive layer 150 is at least partially positioned between second insulator layer 132 and third insulator layer 133. Furthermore, second insulator layer 132 is at least partially positioned between return conductive layer 150 and interconnecting conductive layer 140 and electrically insulates return conductive layer 150 and interconnecting conductive layer 140 away from return connection 129.

Referring to FIG. 6A, in some examples, each of one or more bus bars 152 and second conductive island 142 extend past an edge of second insulator layer 132 to directly interface with each other and form return connection 129. In the examples, first insulator layer 131 and third insulator layer 133 may be sealed against each other, which forms the second edge 119.

Figure 7E:
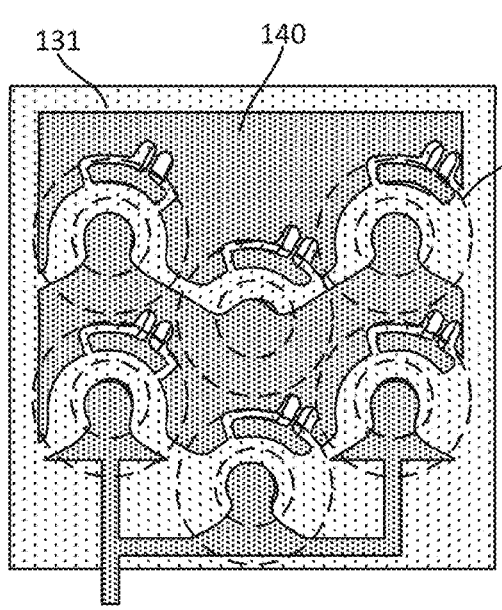
Figure 7F:
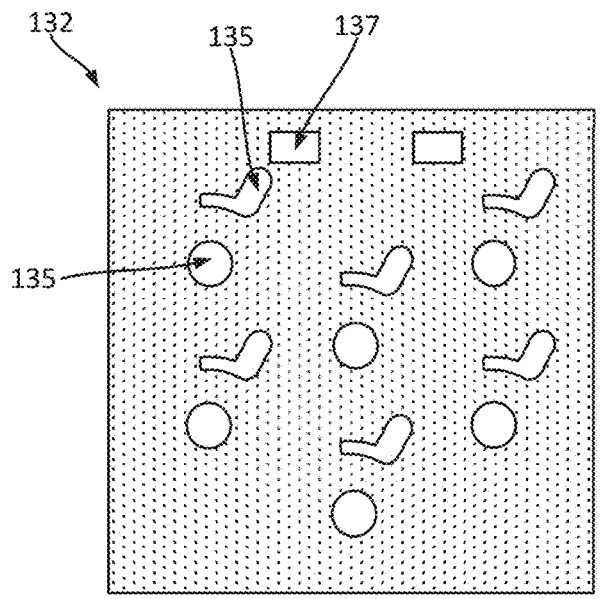
Figure 7G:
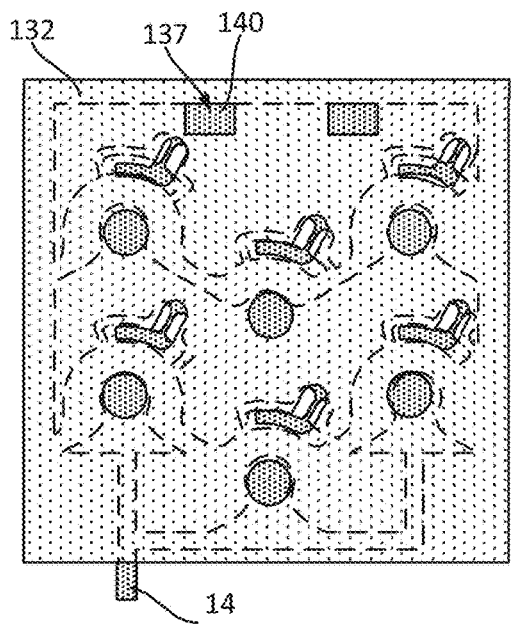

Alternatively, second insulator layer 132 comprises return-connection opening 137 as, e.g., is schematically shown in FIGS. 7F, 7G, and 7I. In these examples, a portion of one or more bus bars 152 extends through return-connection opening 137 forming return connection 129. Furthermore, in these examples, second insulator layer 132 may be sealed against each of first insulator layer 131 and third insulator layer 133 thereby collectively forming second edge 119.

Referring to FIGS. 7A-7K, in some examples, each of first conductive island 141 and second conductive island 142 comprises contact-forming portions 146 for forming electrical connections with batteries 102. Each of first insulator layer 131, second insulator layer 132, and third insulator layer 133 comprises insulator openings 135 aligned with contact-forming portions 146. Neither one of one or more bus bars 152 overlaps with insulator openings 135. This feature ensures that contact-forming portions 146 remain accessible through other layers of flexible interconnect circuit 110.

FIGS. 7A-7K are schematic top views of batteries 102 and various components of flexible interconnect circuit used to interconnect these batteries 102, in accordance with some examples. Specifically, FIG. 7A illustrates six batteries, showing two types of battery terminals 103. While cylindrical cells are shown herein, one having ordinary skill in the art that other types of cells having battery terminals on the same side are also within the scope. For example, batteries 102 can be prismatic cells. FIG. 7B illustrates first insulator layer 131 comprising insulator openings 135. FIG. 7C illustrates first insulator layer 131 positioned over batteries 102 such that insulator openings 135 are aligned with battery terminals 103. It should be noted that any assemblies shown in FIGS. 7B-7J are hypothetical and are used to illustrate the alignment of various components. Flexible interconnect circuit 110 is fully assembled and integrated before being connected to batteries 102.

FIG. 7D illustrates interconnecting conductive layer 140 showing configurations and arrangement of different conductive islands, which are described below. It should be noted that these conductive islands are supported by first insulator layer 131 and second insulator layer 132. However, contact-forming portions 146 protrude past the edges of all insulator layers, i.e., within corresponding insulator openings 135. FIG. 7E illustrates interconnecting conductive layer 140 positioned over the first insulator layer 131 to show overlap between battery terminals 103 and contact-forming portions 146 (these components are interconnected when flexible interconnect circuit 110 is connected to batteries 102). FIG. 7F illustrates second insulator layer 132 comprising insulator openings 135. In this example, second insulator layer 132 also comprises return-connection opening 137. FIG. 7G illustrates second insulator layer 132 positioned interconnecting conductive layer 140 such that insulator openings 135 are aligned with contact-forming portions 146, providing access to contact-forming portions 146.

Figure 7H:
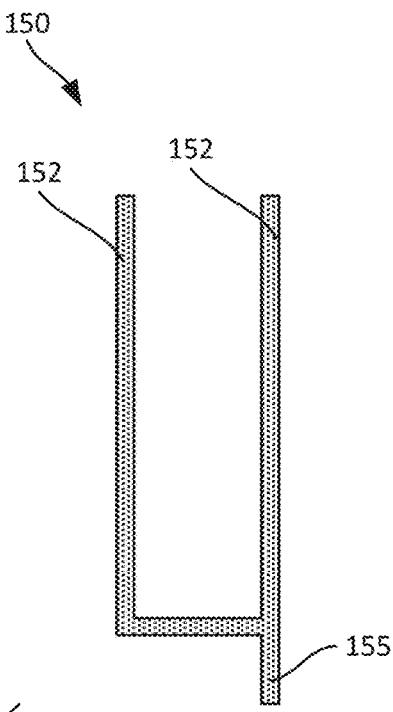

FIG. 7H illustrates return conductive layer 150 comprising two bus bars 152 and second external terminal 155. In this example, all components of return conductive layer 150 are monolithic. FIG. 7I illustrates return conductive layer 150 positioned over second insulator layer 132 such that bus bars 152 extend between and do not overlap with insulator openings 135. Furthermore, the end of bus bars 152, extending to second edge 119, overlap with return-connection opening 137 thereby allowing return conductive layer 150 to form return connections 129 with interconnecting conductive layer 140 or, more specifically, with second conductive island 142 in this example. FIG. 7J illustrates third insulator layer 133 comprising insulator openings 135. Finally, FIG. 7K illustrates third insulator layer 133 positioned over return conductive layer 150 thereby completing flexible interconnect circuit 110.

FIGS. 7A-7K represent a stacked example of flexible interconnect circuit 110, where interconnecting conductive layer 140 and return conductive layer 150 are positioned over each other and separated by second insulator layer 132. Another example may be referred to as a side-by-side example, which will now be described with reference to FIGS. 8A and 8B. Specifically, FIG. 8A is a schematic side cross-sectional view of flexible interconnect circuit 110. Flexible interconnect circuit 110 comprises first insulator layer 131 and second insulator layer 132 such that both interconnecting conductive layer 140 and return conductive layer 150 are positioned between first insulator layer 131 and second insulator layer 132. The insulation between interconnecting conductive layer 140 and return conductive layer 150 is provided by the spatial arrangement of these components as could be seen in FIG. 8B. Return connection 129 can be formed directly between interconnecting conductive layer 140 and return conductive layer 150 (not shown in FIG. 8B) or through batteries 102 as, e.g., is shown in FIG. 8A.

In some examples, the portion of flexible interconnect circuit 110 comprising return conductive layer 150, is configured to bend relative to the portion of flexible interconnect circuit 110 comprising interconnecting conductive layer 140, to an angle of at least 90° as, e.g., is shown in FIG. 8A. As such, the portion of flexible interconnect circuit 110 comprising return conductive layer 150 can form a "skirt" like structure along the side of batteries 102. In some examples, the portion of flexible interconnect circuit 110 comprising return conductive layer 150 can fold and stack over the portion of flexible interconnect circuit 110 comprising interconnecting conductive layer 140 (now shown).

Double-Layered Tab Examples

Figure 9A:
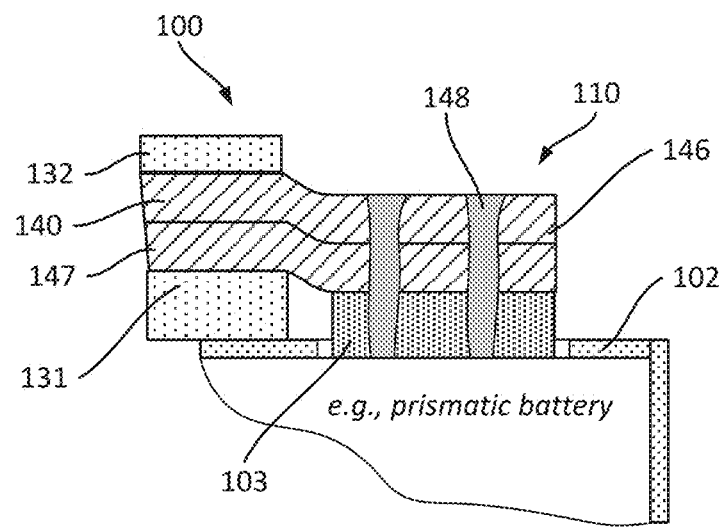
FIGS. 9A and 9B are schematic side cross-sectional views of a flexible interconnect circuit comprising two conductive layers, in accordance with some examples.
Figure 9B:
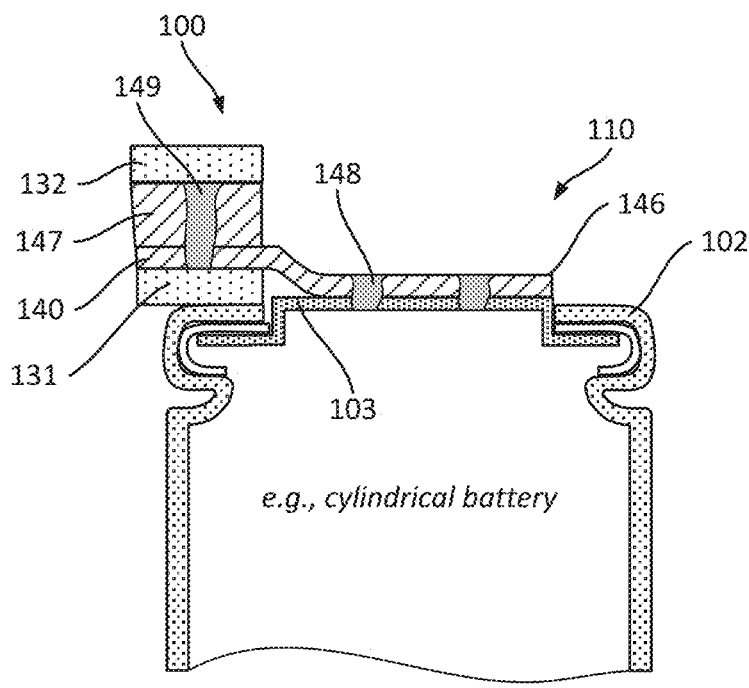

In some examples, flexible interconnect circuit 110 comprises multiple conductive layers, such as conductive layer 140 and additional conductive layer 147, e.g., as shown in FIGS. 9A and 9B. For example, multiple conductive layers (vs. one conductive layer having the same total thickness as these multiple conductive layers) can be used to improve the flexibility of flexible interconnect circuit 110 (e.g., its out-of-plane bending). Furthermore, different conductive layers in the same flexible interconnect circuit 110 can have different patterns/footprints (e.g., to achieve desired current densities through various portions of flexible interconnect circuit 110). In other words, a stack of multiple conductive layers can have different thicknesses at different parts of flexible interconnect circuit 110 such that these different thicknesses are provided by a different number of conductive layers. For example, a fusible link can be formed by only one layer in the multilayered stacks, e.g., with this layer or, more specifically, the fusible link of this layer protruding past other layers in the stack. Overall, multiple conductive layers provide additional functionalities of flexible interconnect circuit 110 that are not available in the single-layer design.

When flexible interconnect circuit 110 comprises multiple conductive layers, these conductive layers may be interconnected, e.g., by welding, soldering, and/or other methods. These interconnections are provided in addition to direct mechanical contact among these conductive layers provided by stacking. It should be noted that this direct mechanical contact (i.e., surface-to-surface contact) may not provide sufficient connection among the layers, e.g., due to surface oxidation. Furthermore, interconnection provides mechanical support to the different conductive layers relative to each other.

These connections among multiple conductive layers can be provided at multiple different locations within the overlapping footprints of the layers. It should be noted that flexible interconnect circuit 110 or, more specifically, the circuit's conductive layers comprise contact-forming portions 146, which are used for making connections between flexible interconnect circuit 110 and various external components. For example, FIGS. 9A and 9B illustrate two examples of flexible interconnect circuit 110 being connected to batteries 102 or, more specifically, one of contact-forming portions 146 being connected to a corresponding one of battery terminals 103. However, other external components and connections are also within the scope.

FIG. 9A illustrates an example in which external connection feature 148 (e.g., a weld) between flexible interconnect circuit 110 and battery 102 is also used for interconnecting conductive layer 140 and additional conductive layer 147 of flexible interconnect circuit 110. In other words, both conductive layer 140 and additional conductive layer 147 comprises contact-forming portions 146 that extend to battery 102 and both are connected to this battery 102 using external connection feature 148 (with two instances this feature shown in FIG. 9A). This external connection feature 148 also interconnects these contact-forming portions 146 of both conductive layer 140 and additional conductive layer 147. As such, conductive layer 140, additional conductive layer 147, and battery 102 are all interconnected in the same location. It should be noted that conductive layer 140 and additional conductive layer 147 can be additionally connected at other locations, e.g., other contact-forming portions 146 and/or away from contact-forming portions 146 (e.g., multi-layered connection feature 149 described below with reference to FIG. 9B).

FIG. 9B illustrates another example in which external connection feature 148 (e.g., a weld) between flexible interconnect circuit 110 and battery 102 is only formed by also used for interconnecting conductive layer 140. Additional conductive layer 147 does not extend to this battery 102 and does not have a corresponding contact-forming portion at this location. Additional conductive layer 147 is still indirectly electrically coupled to this battery 102, by conductive layer 140. Conductive layer 140 comprises contact-forming portion 146 that extends to the battery 102 and forms external connection feature 148. FIG. 9B also illustrates multi-layered connection feature 149 (e.g., a weld, a solder), which is positioned away contact-forming portions 146 of conductive layer 140 and additional conductive layer 147 and which provides a directly electrical connection between conductive layer 140 and additional conductive layer 147 (in addition to the surface contact between these layers).

In-Plane Stretching of Flexible Interconnect Circuits

Figure 10A:
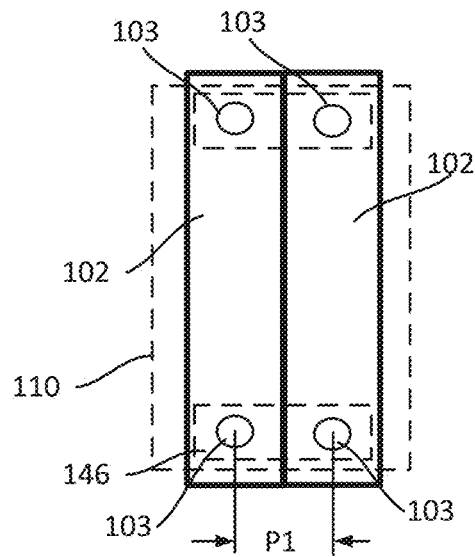
FIGS. 10A and 10B are schematic top views of prismatic batteries interconnected by a flexible interconnect circuit such that different parts of the conductive components are movable relative to each other within a plane of the flexible interconnect circuit, in accordance with some examples.

Flexible interconnect circuit 110 can be a substantially planar structure that is connected to other components such as batteries 102 in battery pack 100, shown in FIG. 10A. The in-plane flexibility/stretchability of flexible interconnect circuit 110 can be limited due to the structure of flexible interconnect circuit 110 and the flexibility of various components forming flexible interconnect circuit 110. For example, flexible interconnect circuit 110 can comprise conductive components 120 positioned between first insulator layer 131 and second insulator layer 132, which are not stretchable. In other words, different parts of flexible interconnect circuit 110 can have limited mobility within the plane of flexible interconnect circuit 110 (e.g., within the X-Y plane). At the same time, flexible interconnect circuit 110 can have excellent out-of-plane flexibility, i.e., able to bend around any axes within the X-Y plane.

Figure 10B:
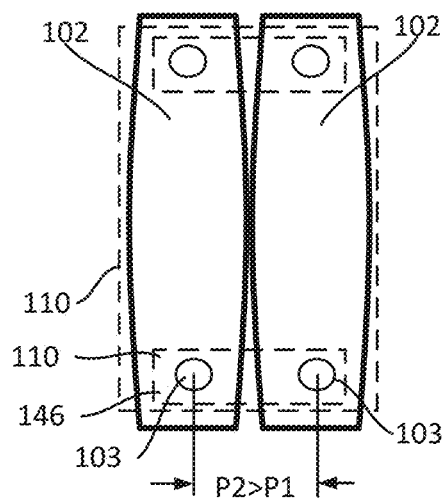

The in-plane flexibility can be important for various applications such as battery pack 100. For example, FIG. 10A illustrates prismatic battery cells 102 connected to flexible interconnect circuit 110 or, more specifically, battery terminals 103 connected to contact-forming portions 146 of flexible interconnect circuit 110. Referring to FIG. 10B, as batteries 102 swell, the distance between battery terminals 103 of the adjacent cells may change. The mobility of battery terminals 103 requires relative mobility from contact-forming portions 146 to ensure that the electrical connections between these components are preserved. It should be noted that other circuit applications requiring such in-plane flexibility/stretchability are also within the scope. For example, external components coupled to flexible interconnect circuit 110 can move in one or more directions within the X-Y plane. These movements can stress the connections between flexible interconnect circuit 110 and these components unless the corresponding portions of flexible interconnect circuit 110 can move accordingly.

Figure 11A:
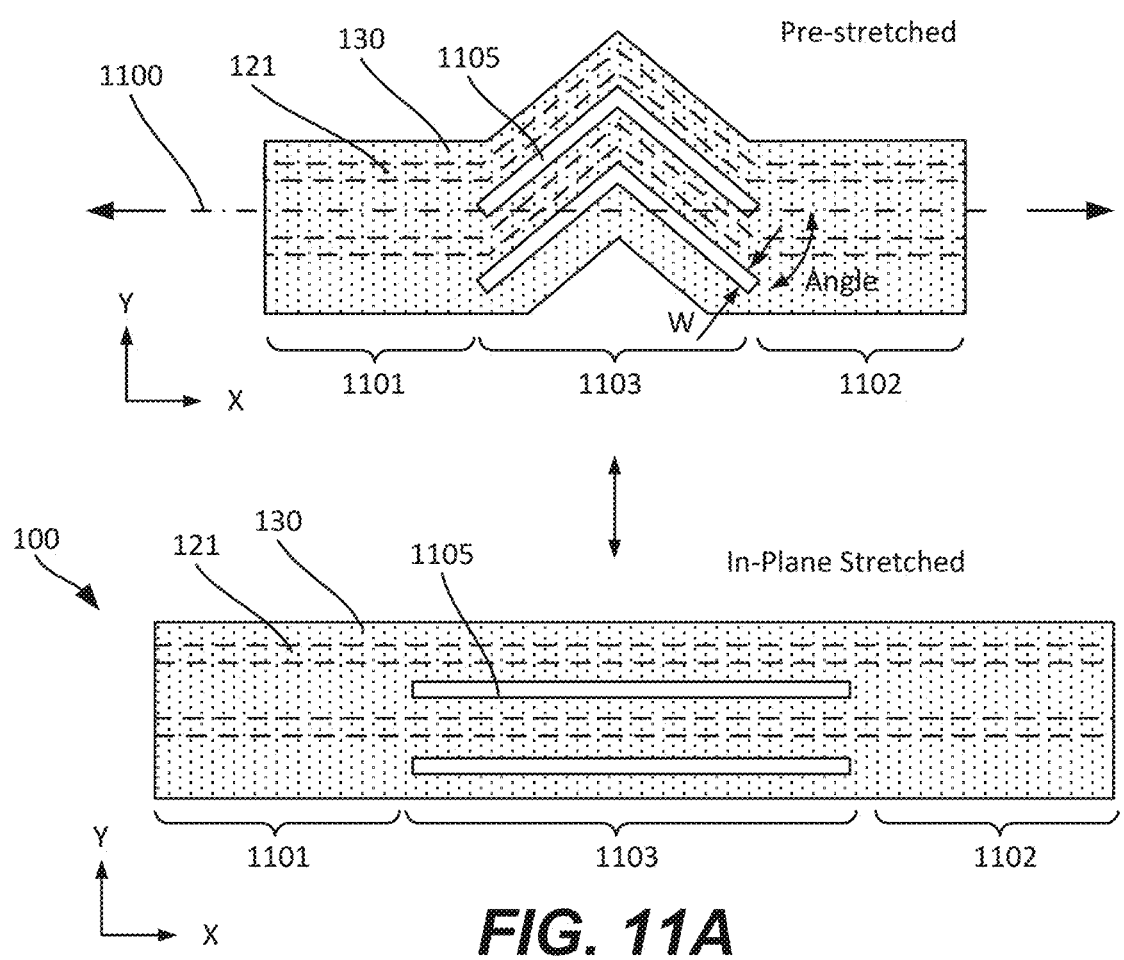
FIGS. 11A-11D are schematic top views of different examples of a flexible interconnect circuit illustrating the movement of different parts of the flexible interconnect circuit during the in-plane stretching, in accordance with some examples.
Figure 11B:
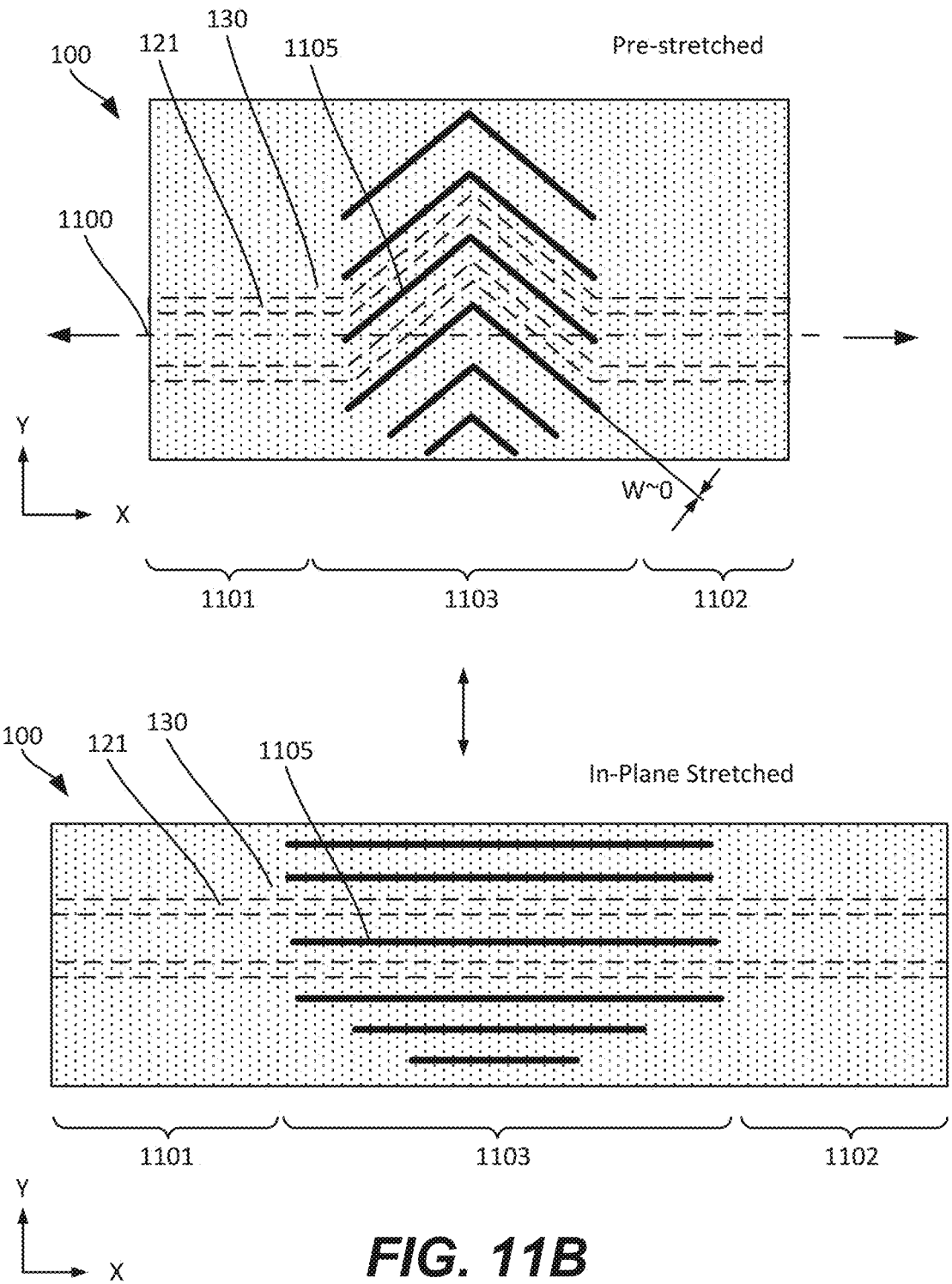

Referring to FIGS. 11A-11D, flexible interconnect circuit 110 comprises insulator layers 130, such as first insulator layer 131 and second insulator layer 132, forming a stack. Flexible interconnect circuit 110 comprises first circuit portion 1101, second circuit portion 1102, and third circuit portion 1103, positioned between first circuit portion 1101 and second circuit portion 1102 along circuit axis 1100. Flexible interconnect circuit 110 or, more specifically, third circuit portion 1103 comprises one or more slits, forming a slit set 1105. At least a portion of each slit in slit set 1105 extends at an angle greater than 0° relative to circuit axis 1100 or, more specifically, greater than 15° or even greater than 30°. For example, the angle can be between 15° and 60° or, more specifically, between 30° and 50°, such as about 45°. In some examples, at least one slit in slit set 1105 comprises multiple portions that are not colinear with each other, such that each of these multiple portions forms the above-referenced angle relative to circuit axis 1100. In some examples, at least one slit in slit set 1105 has a chevron pattern (e.g., as shown in FIGS. 11A and 11B). It should be noted that these references to slit set 1105 are when flexible interconnect circuit 110 is in a free form (not stretched), i.e., when no tension is applied to flexible interconnect circuit 110. One having ordinary skill in the art would understand that slit set 1105 will change shape when flexible interconnect circuit 110 is under tension. Even though the in-plane stretched examples in FIGS. 11A and 11B show the slits extending along circuit axis 1100, the shape of the stretched slits may depend on the level of stretching. Furthermore, even when the stretched slits are linear (extend along circuit axis 1100), further stretching is possible.

Figure 11C:
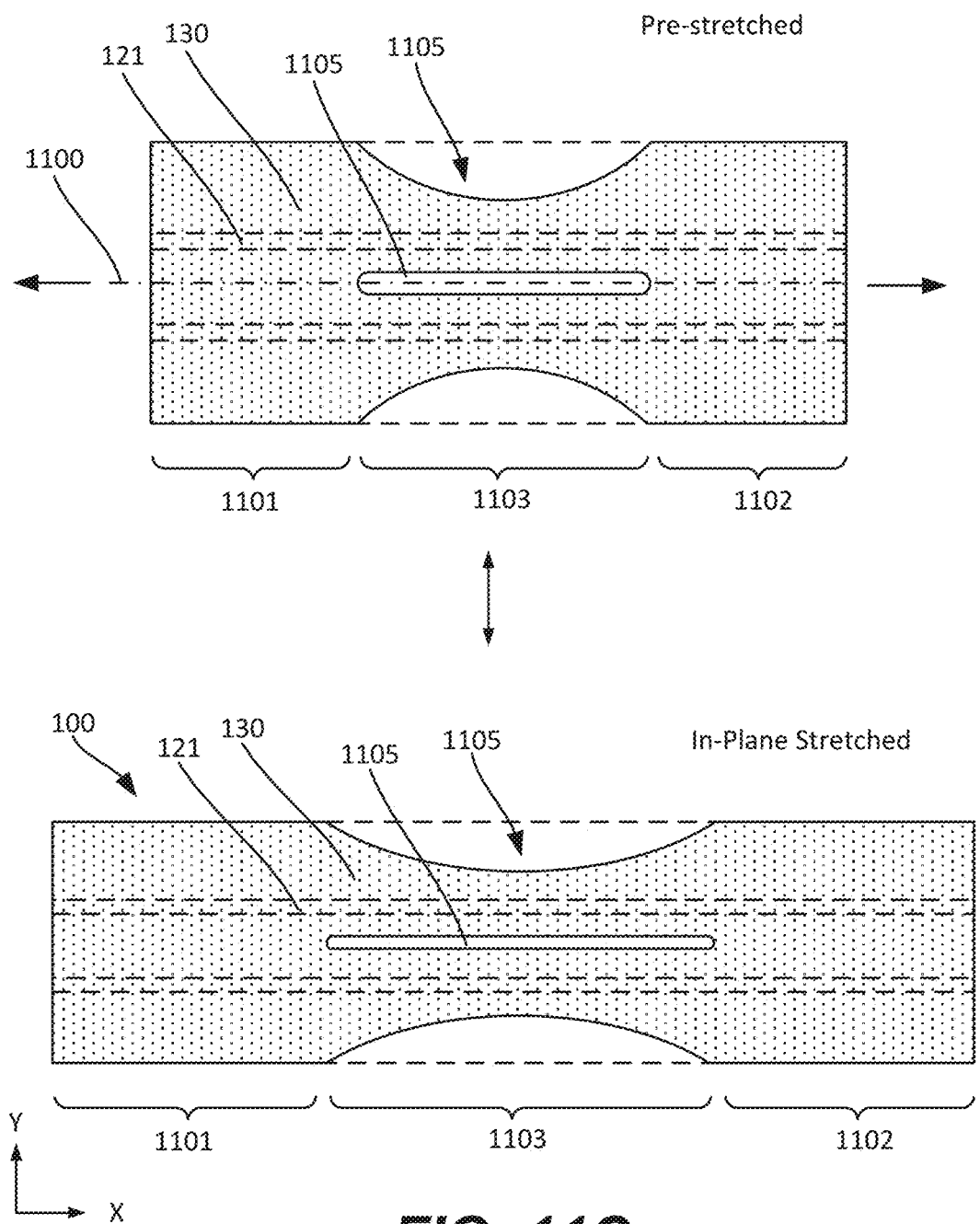
Figure 11D:
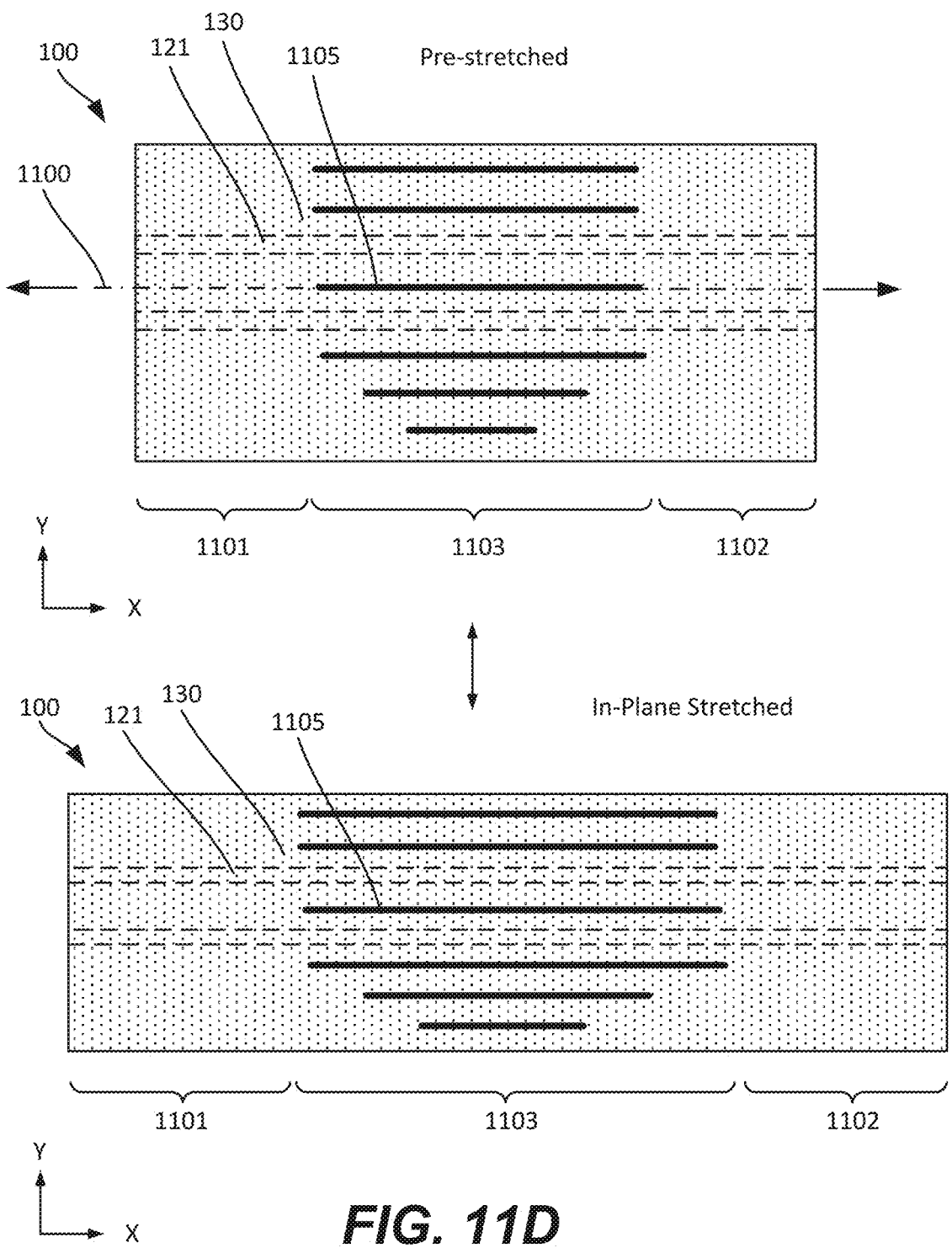

In some examples, e.g., shown in FIGS. 11C and 11D, some slits may be linear (extend along circuit axis 1100) even in pre-stretched states. In these examples, third circuit portion 1103 stretches through the elongation of various circuit components forming this third circuit portion 1103 rather than by spatially rearranging these components in the plane (e.g., as shown in FIGS. 11A and 11B). Furthermore, slits may have various curved shapes and effectively remove portions of insulator layers 130, e.g., as shown in FIG. 11C with the removed "shoulders".

The primary purpose of slit set 1105 is such that flexible interconnect circuit 110 can stretch, e.g., third circuit portion 1103 becomes longer as e.g., schematically shown by the transition in each of FIGS. 11A-11D. It should be noted that while third circuit portion 1103 elongates under tension applied to flexible interconnect circuit 110, first circuit portion 1101 and second circuit portion 1102 can remain substantially unchanged (e.g., retain substantially the same length). For example, the elongation ratio between a portion of flexible interconnect circuit 110 with slit set 1105 and no slits can be at least 5, at least 10, or even at least 25.

It should be noted that flexible interconnect circuit 110 further comprises conductive components 120 (e.g., conductive traces 121) positioned between and supported by insulator layers 130. In some examples, at least one of conductive components 120/conductive traces 121 extends between two adjacent slits in slit set 1105 as, e.g., is schematically shown in FIGS. 11A-11D. Conductive components 120 can be positioned away from the slit edges to protect these conductive components 120 from the environment.

In some examples, each slit in slit set 1105 has a width of less than 5 millimeters, less than 2 millimeters, or even less than 1 millimeter as, e.g., is schematically shown in FIGS. 11B and 11D. Such slits may be referred to as "zero-gap" slits. The benefit of such slits is insulator layers 130 are made more stretchable (by introducing slit set 1105) without removing significant portions of these insulator layers 130 (e.g., maintaining adequate insulation of conductive traces 121, using insulator layers 130 for support and other functions).

Current Flow Controls in Flexible Interconnect Circuits

Figure 12A:
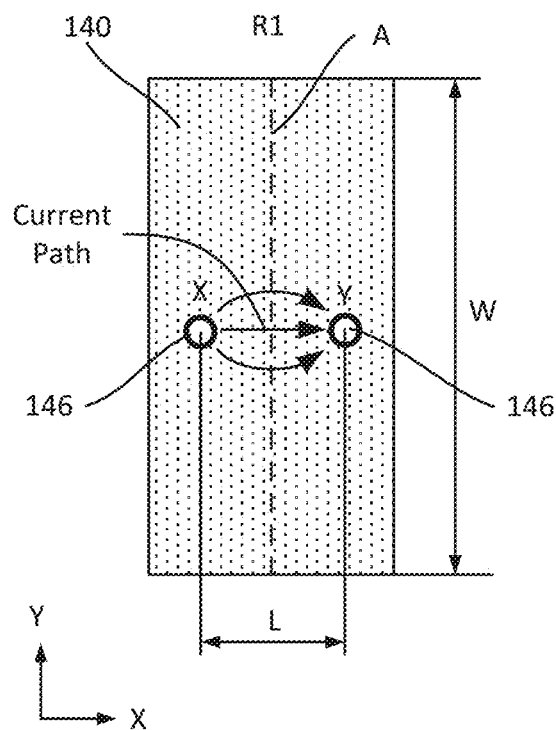
FIG. 12A is a schematic view of a conductive layer comprising contact-forming portions illustrating a current path between these contact-forming portions, in accordance with some examples.

FIG. 12A is a schematic view of conductive layer 140 comprising contact-forming portions 146 illustrating a current path between these contact-forming portions 146, in accordance with some examples. The current path takes the shortest distance between contact-forming portions 146 resulting in a specific current density through various parts of conductive layer 140. These current densities correspond to resistive heating of conductive layer 140, and this heating can be different in different parts of conductive layer 140, e.g., due to different current densities. A combination of resistive heating and heat dissipation to the environment can be considered during the design of flexible interconnect circuit 110 or, more specifically, during the design of conductive layer 140. For example, conductive layer 140 can be shaped in a particular way to achieve the desired current density. This shaping can be achieved by the footprint boundaries of different conductive islands forming conductive layer 140 as well as set of current controlling slits 1200 provided within these conductive islands. Unlike the footprint boundaries, which separate different conductive islands from each other, set of current controlling slits 1200, which is provided in a conductive island, does not separate this island into separate disjoined sub-islands but simply alters the current density through the island. All parts of this island remain monolithically connected. The terms "conductive island(s)" and "conductive layer" are used interchangeably in the following description of this section.

Referring to the example in FIG. 12A, the current density, and the resistive heating are the highest along the line connecting contact-forming portions 146 because the current takes the shortest path. As such, conductive layer 140 will heat the most along the straight line connecting these contact-forming portions 146. However, in some examples, the heating in this portion of conductive layer 140 can be undesirable.

Furthermore, the current density distribution within conductive layer 140 determines the resistance among contact-forming portions 146 of this conductive layer 140. With three or more contact-forming portions 146 in the same conductive layer 140, the resistance between different set pairs of these contact-forming portions 146 can be different (e.g., when one pair of contact-forming portions 146 is spaced further apart from each other than another pair). These differences in resistance can be undesirable for some applications. For example, in conventional battery packs, bussing typically follows the geometry of the module, and the bussing is limited to the immediate area between cell terminals (i.e., the current taking the shortest path). As such, battery cells in the same battery module can experience different electrical resistance relative to the module terminals (e.g., battery cells positioned further away from the module terminals see higher resistances). These resistance variations can be detrimental to the operation of battery modules causing cell dis-balancing (i.e., cells having different states of charge in the same battery module). The issue becomes even more severe when battery modules/cells experience high currents, e.g., fast charging of electric vehicles (EVs). Additionally, battery cells can have their internal resistance variations (e.g., about 3% variance in the same lot of cells), which further complicates the battery module operation.

Figure 12B:
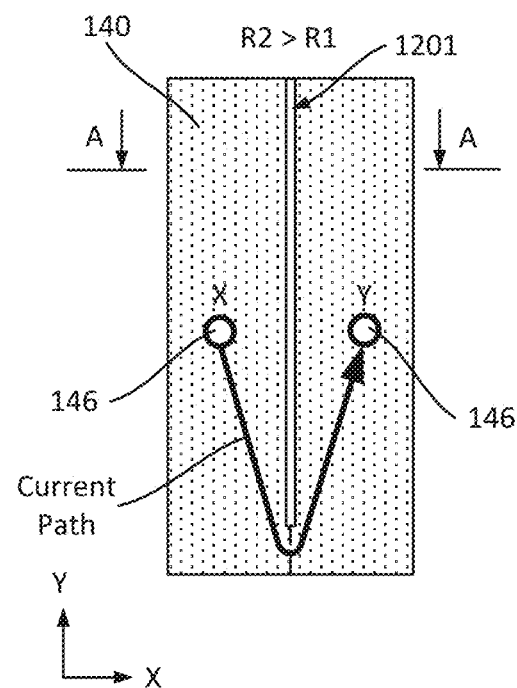
FIG. 12B is a schematic view of a conductive layer comprising contact-forming portions and a current controlling slit partially separating the conductive layer and extending between the contact-forming portions, in accordance with some examples.

It has been found that while the current takes the shortest path in a conductor, a current-controlling slit can be introduced to the conductor to alter the current path and produce different current density distributions within conductive layer 140. This change in the current density distribution can be used to change the resistive heating distribution and/or to alter the resistance between different pairs of contact-forming portions 146. Returning to the example in FIG. 12A, it may be desirable to route the current differently within conductive layer 140 such that conductive layer 140 experiences resistive heating in different areas (e.g., along the bottom edge) and such that the resistance between contact-forming portions 146 is increased (e.g., to match some other resistance). This can be achieved by introducing current controlling slit 1201 or, more generally, set of current controlling slits 1200 to conductive layer 140, e.g., as schematically shown in FIG. 12B.

Figure 12C:
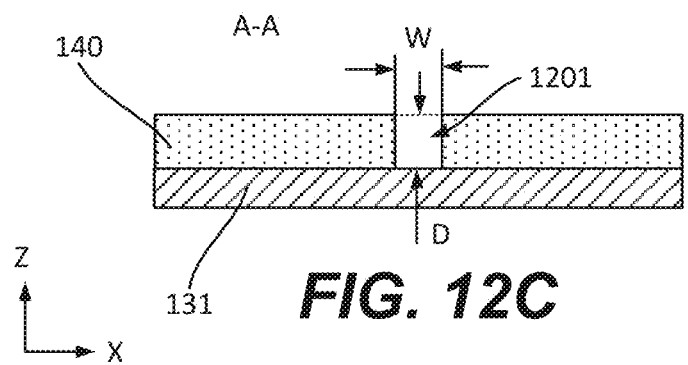
FIG. 12C is a schematic cross-sectional side view of a conductive layer comprising a current controlling slit fully extending through the conductive layer, in accordance with some examples.
Figure 12D:
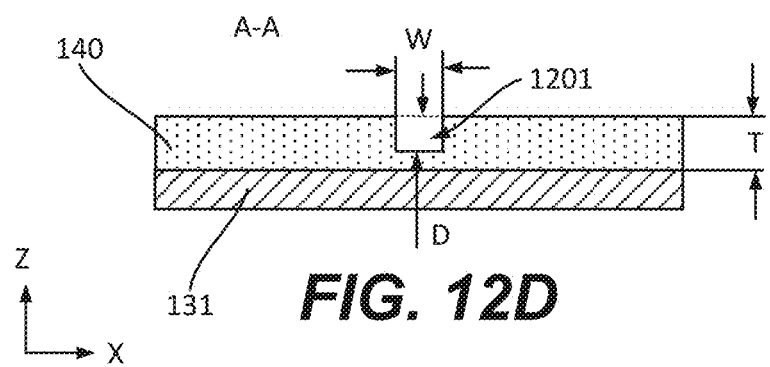
FIG. 12D is a schematic cross-sectional side view of a conductive layer comprising a current controlling slit partially extending through the conductive layer, in accordance with some examples.

Unlike conventional foil patterning (e.g., mechanical slitting, etching), current controlling slit 1201 may have a width (W) of less than 1 millimeter, less than 100 micrometers, more specifically, less than 75 micrometers, or even less than 50 micrometers, e.g., as schematically shown in FIGS. 12C and 12D. The minimal width of current controlling slit 1201 allows keeping most of the remaining material of conductive layer 140 that is still available to conduct the electric current. In other words, current controlling slit 1201 alters the current density distribution without removing significant amounts of the material. For example, a wider slit will narrow the two portions of conductive layer 140 positioned on the different sides of this slit and increase the current density/resistive heating through these portions. Various metal patterning techniques can be used for creating set of current controlling slits 1200 having such a small width.

In some examples, the ratio of the surface area by set of current controlling slits 1200 relative to the total surface area of conductive layer 140 (including set of current controlling slits 1200) is less than 5%, less than 1%, or even less than 0.1%. As such, set of current controlling slits 1200 should be distinguished from changing the overall footprint/shape of conductive layer 140.

Even with such small widths, set of current controlling slits 1200 can be formed in conductive layer 140 that has a thickness of at least 50 micrometers, at least 150 micrometers, or even at least 300 micrometers, e.g., between 50-500 micrometers. Referring to FIGS. 12C and 12D, in some examples, each slit has an aspect ratio of the slit width (W) to the slit depth (D) of less than 10, less than 5, or even less than 1. Referring to FIG. 12C, in some examples, a slit is a through slit forming a full separation between two portions of conductive layer 140 (at the location of the slit). In other words, the slit extends through the entire thickness of conductive layer 140 between opposites sides of conductive layer 140. Alternatively, referring to FIG. 12D, a slit is a partial slit providing only a partial separation between two portions of conductive layer 140 (at the location of the slit). Below the slit, the two portions of conductive layer 140 remain monolithic/have a monolithic contact, which provides some reduced electrical conductivity below the slit. It should be noted that while the electric current can still pass through the partial slit, the path is altered (the cross-sectional area is reduced) thereby changing the current density distribution. In some ways, the remaining portion of conductive layer 140 (under the slit) becomes an embedded resistance. On the other hand, the current can not pass across the through slit. Referring to FIG. 12D, in some examples, a partial slit can have a ratio of the slit depth (D) to the conductive layer thickness (T) of greater than 0.25, greater than 0.5, or even greater than 0.75.

In some examples, a through slit and/or a partial slit can remain unfilled. Alternatively, a through slit and/or a partial slit can be filled with an insulating material (e.g., inner dielectric). This slit filling can occur during the lamination of conductive layer 140 comprising set of current controlling slits 1200 to one or more insulator layers 130.

Referring to FIGS. 12C and 12D, two portions of conductive layer 140 positioned on different sides of current controlling slit 1201 can be supported relative to each other by first insulator layer 131. In some examples, second insulator layer 132 (not shown) is positioned on the other side such that conductive layer 140 is positioned between first insulator layer 131 and second insulator layer 132. It should be noted that the two portions of conductive layer 140 (positioned on different sides of current controlling slit 1201) remain interconnected and monolithic with each other (away/at the end of current controlling slit 1201, such as the bottom edge of conductive layer 140 in FIG. 12B). In some examples, at least one slit in set of current controlling slits 1200 at least partially overlaps with first insulator layer 131, e.g., as shown in FIGS. 12C and 12D.

Figure 12E:
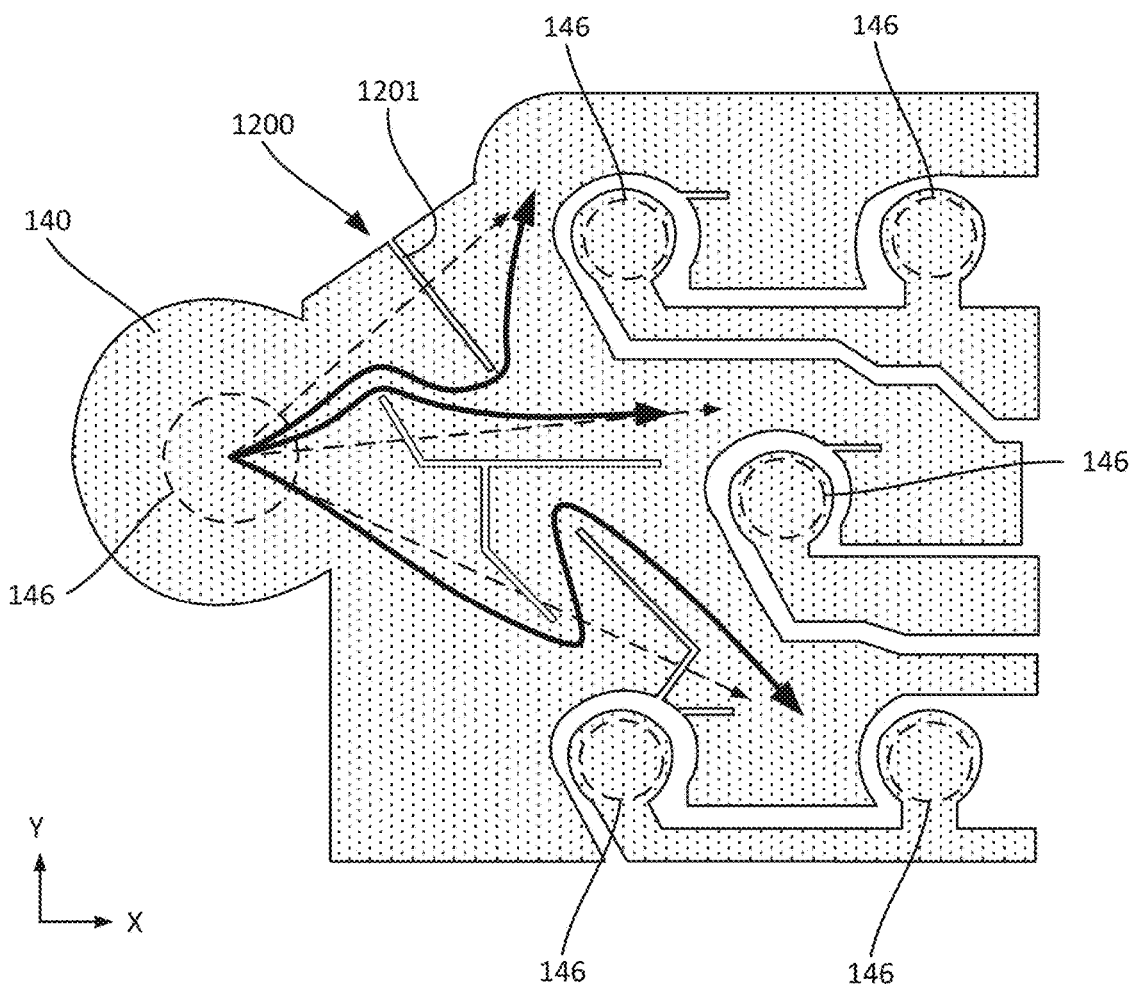
FIG. 12E illustrates an example of a conductive layer (of a flexible interconnect circuit) comprising a set of current-controlling slits positioned in specific locations to achieve the desired current density/resistive heating distribution.

FIG. 12E illustrates an example of conductive layer 140 of flexible interconnect circuit 110 with set of current controlling slits 1200 positioned in specific locations to achieve the desired current density/resistive heating distribution. Conductive layer 140 comprises multiple contact-forming portions 146, which flow the electric current into/out of conductive layer 140 or, more generally, flexible interconnect circuit 110. Set of current controlling slits 1200 can be also used to control various resistance among these contact-forming portions 146. Flexible interconnect circuit 110 can have at least two contact-forming portions 146 and as many as required connections to flexible interconnect circuit 110. For example, flexible interconnect circuit 110 used for interconnecting ten (10) batteries 102 and operable as a busbar for these batteries can include twenty-two (22) contact-forming portions 146, e.g., two for each battery and two for external connections. It should be noted that flexible interconnect circuit 110 or, more specifically, conductive layer 140 can include multiple disjoined conductive islands, e.g., first conductive island 141 and second conductive island 142. Each conductive island comprises at least two contact-forming portions 146.

Figure 12F:
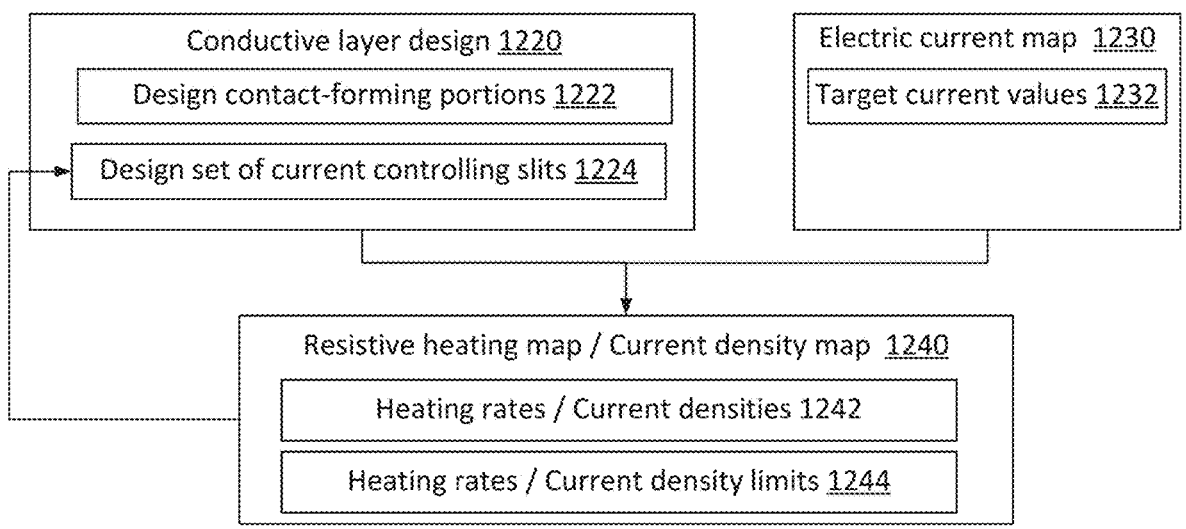
FIG. 12F is a block diagram of various features used for determining the location of a set of current controlling slits in a flexible interconnect circuit, in accordance with some examples.

FIG. 12F is a block diagram of various features used in determining the location of set of current controlling slits 1200 in flexible interconnect circuit 110, which may be used in method 1250 described below. Flexible interconnect circuit 110 has a corresponding conductive layer design 1220 comprising design-contact-forming portions 1222 and set of current controlling slits 1224. Conductive layer design 1220 can be used for the fabrication of conductive layer 140. Specifically, conductive layer design 1220 defines the footprint of conductive layer 140 and various characteristics of set of current controlling slits 1200 (e.g., the number, location, size, and shape) through set of current controlling slits 1224. Method 1250, described below, is used to identify and update set of current controlling slits 1224 in conductive layer design 1220.

Returning to FIG. 12F, flexible interconnect circuit 110 or its conductive layer design 1220 can also have a corresponding electric current map 1230 comprising target current values 1232, e.g., one value through each of comprising design-contact-forming portions 1222. For example, target current values 1232 represents the maximum currents that are allowed through each contact-forming portions 146 during the operation of flexible interconnect circuit 110. A combination of conductive layer design 1220 and electric current map 1230 is used to determine resistive heating map 1240 (e.g., using computer modeling). Because resistive heating is caused by a specific current density, the terms "resistive heating map" and "current density map" are used interchangeably. In some examples, this heat map determination operation is performed experimentally (in addition to or instead of computer modeling), e.g., by applying the actual current (according to target current values 1232) through flexible interconnect circuit 110. Resistive heating map 1240 comprises heating rates 1242 (or current densities) for different points in conductive layer design 1220. It should be noted that the current density through these different points is one of the factors impacting temperatures at these points. Heat dissipation to the environment (e.g., insulators surrounding conductive layer 140) is another factor. It should be also noted that, in some examples, conductive layer 140 has the same uniform thickness and composition at all locations. As such, these factors do not influence heating rates/current densities.

While determining the location of set of current controlling slits 1200, heating rates 1242 (or current densities) can be evaluated based on heating rates limits 1244 (or current density limits), e.g., including a maximum allowable heating rate/current density at any point in conductive layer 140. When any of the heating rates/current densities fall outside of these limits, conductive layer design 1220 is updated by adding/changing the set of current controlling slits 1224 into conductive layer design 1220. The process is repeated until all heating rates/current densities fall within the corresponding limits.

Figure 12G:
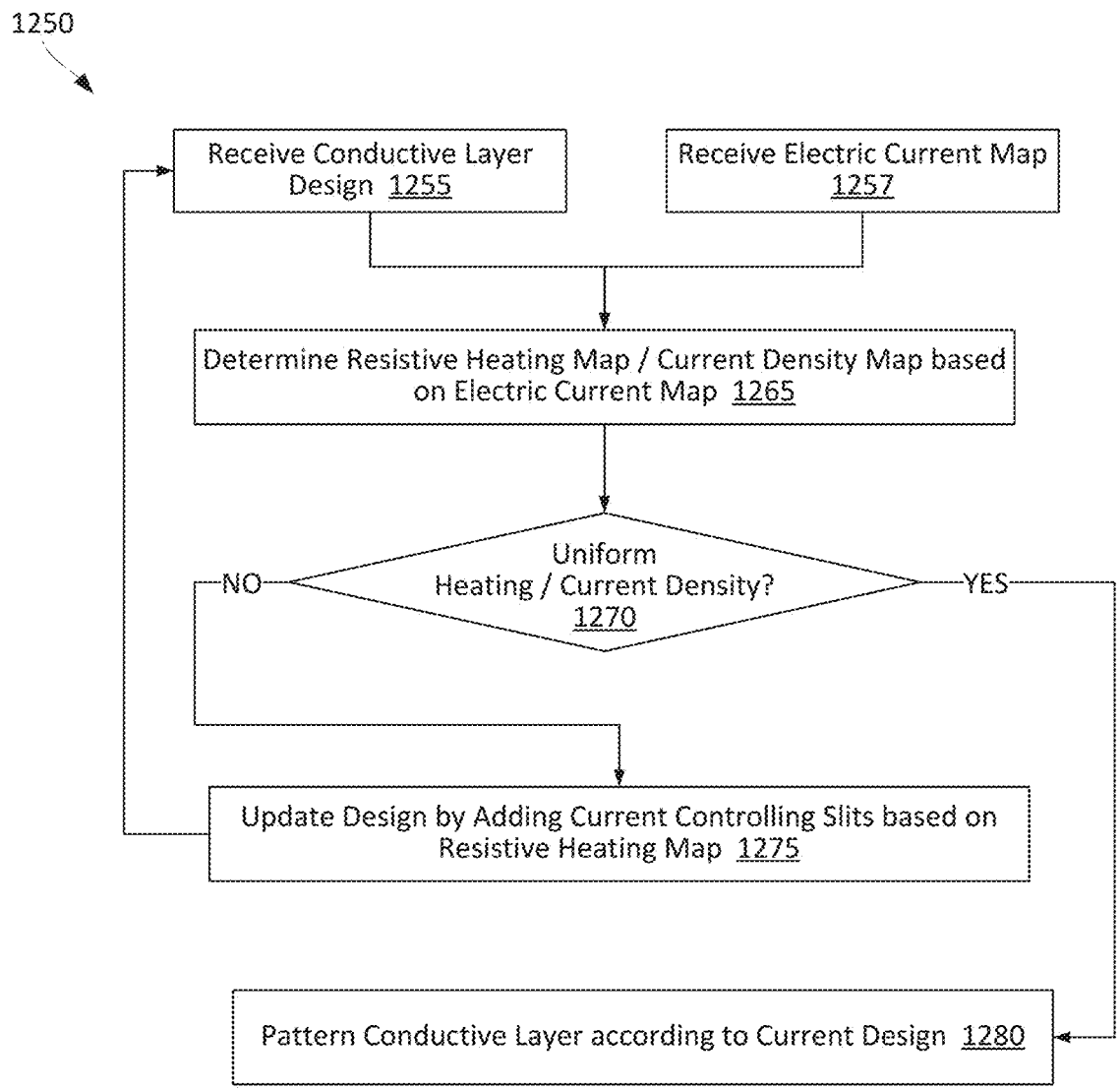
FIG. 12G illustrates a process flowchart corresponding to a method of a fabricating flexible interconnect circuit with the uniform current density provided by a set of current-controlling slits, in accordance with some examples.

FIG. 12G illustrates a corresponding flowchart for method 1250 of fabricating flexible interconnect circuit 110 with the uniform current density provided by set of current controlling slits 1200. Method 1250 may commence with (block 1255) receiving conductive layer design 1220 corresponding to conductive layer 140 of flexible interconnect circuit 110. As noted above, conductive layer design 1220 comprises design-contact-forming portions 1222 corresponding to contact-forming portions 146 of conductive layer 140. In some examples, conductive layer design 1220 comprises set of current controlling slits 1200, e.g., provided in the initial design (before executing method 1250) or provided in the previous rounds of method 1250 (as further described below).

In some examples, method 1250 further comprises (block 1257) receiving electric current map 1230 comprising target current values 1232. As noted above, each of target current values 1232 corresponds to one of design-contact-forming portions 1222. For example, each of these target current values 1232 represents a maximum current to be flowed through a corresponding one of contact-forming portions 146. These maximum currents will cause the maximum heating in conductive layer 140. In some examples, electric current map 1230 also comprises durations of these maximum currents (e.g., based on the design of the circuit). Furthermore, electric current map 1230 can include a current-time profile for each one of design-contact-forming portions 1222.

Method 1250 proceeds with (block 1265) determining resistive heating map 1240 (or a current density map) for conductive layer 140 or, more specifically, for the current version of conductive layer design 1220 based electric current map 1230. This determining step involves a comprehensive analysis of resistive heating. Resistive heating map 1240 can comprise resistive heating rates for different points in conductive layer design 1220. Similarly, a current density map can comprise current density values for different points in conductive layer design 1220.

Figure 12H:
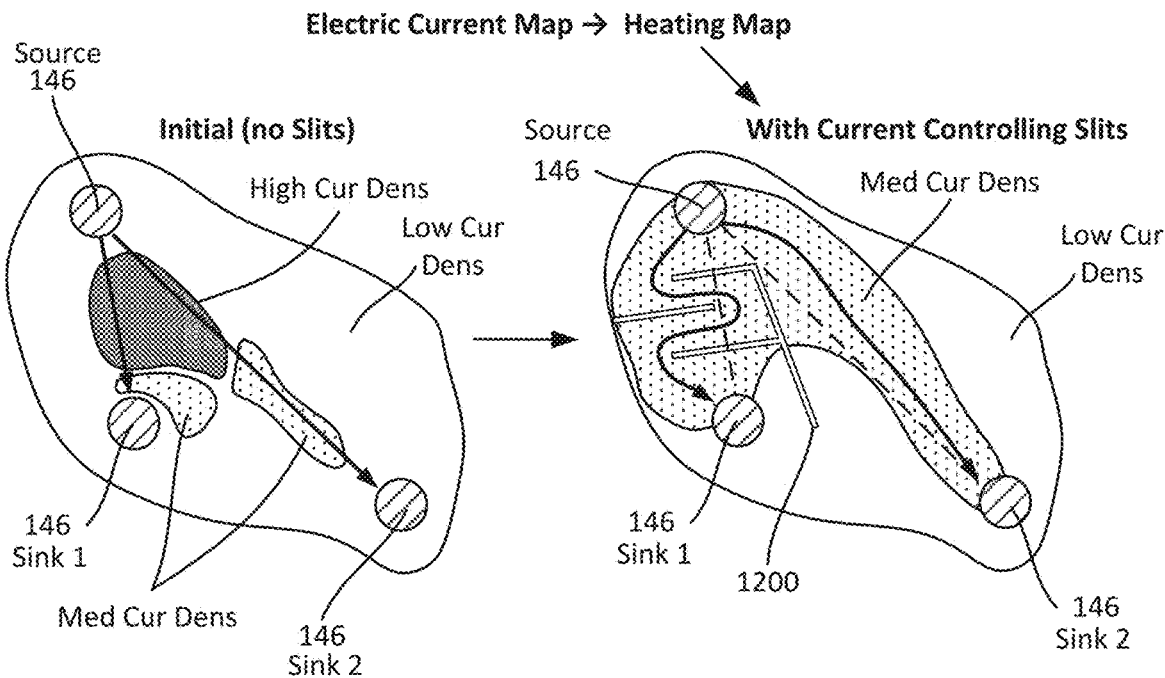
FIGS. 12H and 12I illustrate examples of introducing different sets of current controlling slits to conductive layers, e.g., to make the current density more uniform.
Figure 12I:
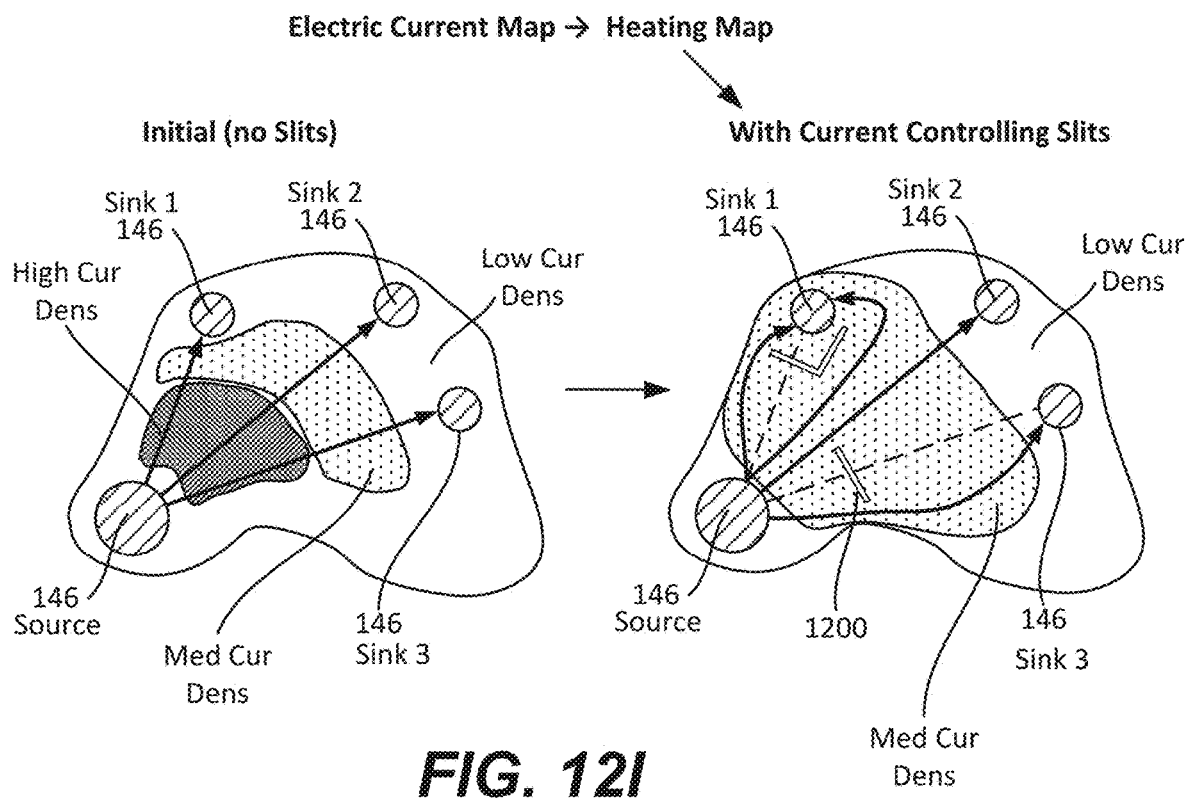
Figure 12J:
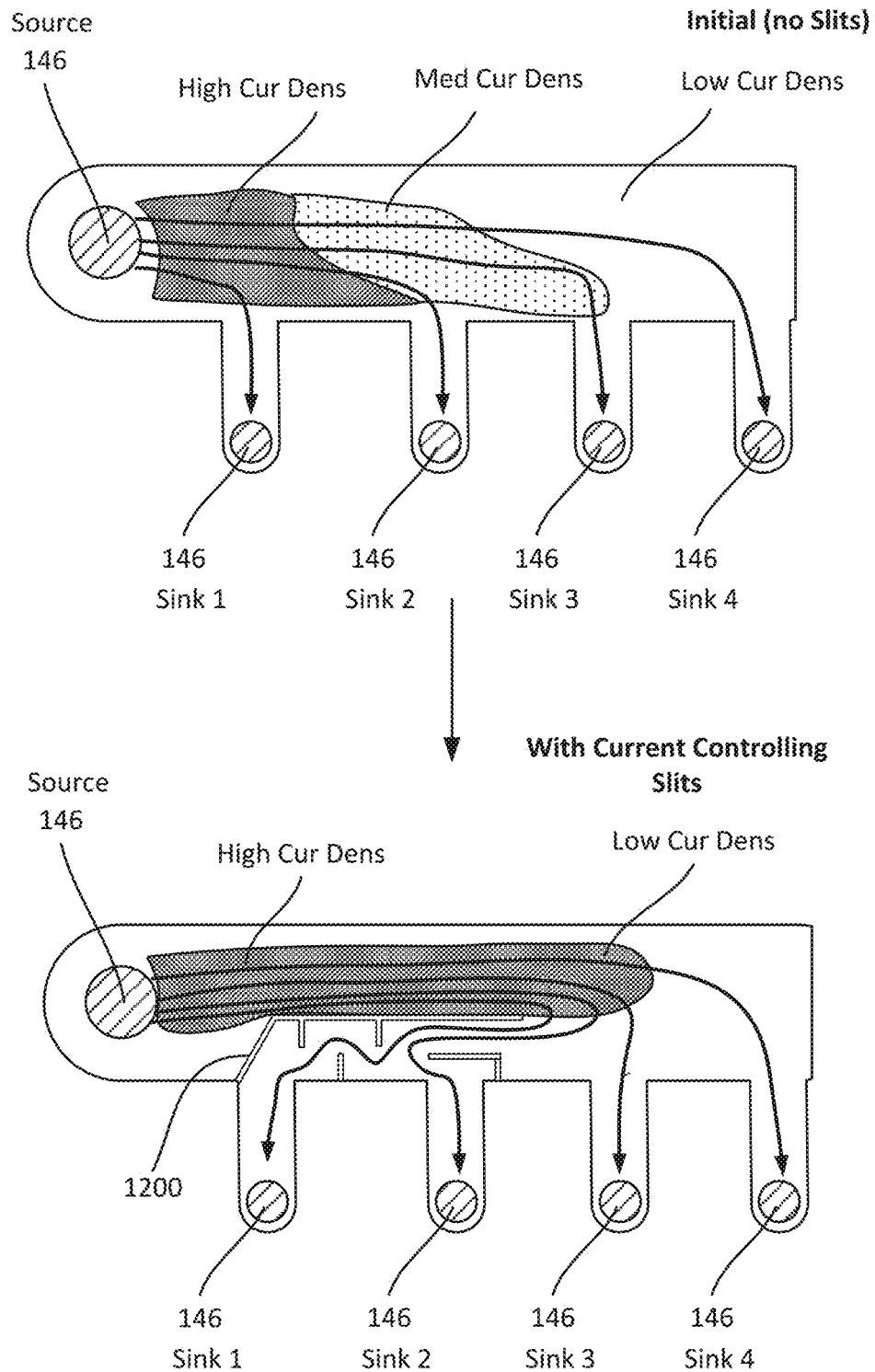
FIG. 12J illustrates an example, in which a set of current controlling slits is introduced to a conductive layer to ensure that the resistance between different pairs of the contact-forming portions is more uniform.

Method 1250 proceeds with (decision block 1270) determining if any of resistive heating rates/current density values fall outside of the corresponding limits 1244. Method 1250 proceeds with (block 1275) updating the design set of current controlling slits 1224 in conductive layer design 1220, when any of resistive heating rates/current density values fall outside of the corresponding limits 1244. For example, a current controlling slit can be introduced through the portion of conductive layer design 1220 experiencing high heating rates/high current densities thereby diverting the current to other parts of conductive layer design 1220. In some examples, this slit design updating operation also considers electric current map 1230 or, more specifically, current density/current direction through the "hot spot" to determine the position, shape, and directions of the slit. Some examples of introducing different sets of current controlling slits 1200 to conductive layers 140 (e.g., to make the current density more uniform) are schematically shown in FIGS. 12H and 12I. FIG. 12J illustrates an example, in which a set of current controlling slits 1200 is introduced to conductive layer 140 to make the resistance between different pairs of contact-forming portions 146 more uniform. Specifically, the design set of current controlling slits 1224 in conductive layer design 1220 is updated to provide resistances between set pairs of contact-forming portions 146 within resistance limits.

It should be noted that this slit design updating operation and the heat mapping/current density determination operation can be performed iteratively (e.g., using various goal-seek algorithms) to achieve the desired heat map. Furthermore, it should be noted that the current controlling slits have a very small width (described above) thereby retaining most of the material for the current transfer, heat sinking, and other purposes, which makes these current controlling slits different from conventional circuit patterning. As such, these current controlling slits can be also referred to as "minimal gap" slits or even "zero gap" slits. The width of the slit is determined by the patterning technique and is generally sufficient to block the current through the slit.

In some examples, determining resistive heating map 1240 for conductive layer 140 comprises accounting for environmental heat losses by conductive layer 140. For example, the presence of other components of flexible interconnect circuit 110 (e.g., insulator layers 130) that are thermally coupled to conductive layer 140 can be accounted for. In some examples, external components (e.g., batteries 102) can be considered due to their thermal coupling to conductive layer 140, e.g., through the electrical coupling to contact-forming portions 146.

Method 1250 proceeds with (block 1280) patterning conductive layer 140 in accordance with conductive layer design 1220.

Overall, current controlling slits are used to manipulate the current path through conductive layer 140, e.g., to achieve a more uniform current density distribution. It should be noted that, unlike conventional bus bars, conductive layer 140 has a uniform thickness and the current density control can only be achieved through the patterning of conductive layer 140 since the thickness is not a controllable feature. Current controlling slits effectively/artificially lengthen the current path between contact-forming portions 146 (e.g., the main module terminals and certain cells).

It should be noted that conductive layer 140 can be used for various applications, e.g., to form voltage sensing traces in a battery module and/or to carry current to the battery during charge/discharge. Each of these examples and potential issues with conventional approaches will now be described in more detail. The efficiency of a battery module is determined by the accuracy of voltage sensing within the module. Using conventional round wires (e.g., having the same cross-sectional profile) for voltage sensing can cause significant resistance variations from one voltage-sensing trace/wire to another trace. These resistance variations usually depend on the length of each wire (e.g., determined by the distance between a battery management system (BMS) and a busbar tapping point of the wire). Some of these resistance variations can be mitigated by software controls (e.g., in the BMS). However, these mitigation aspects are limited and dependent on various assumptions (e.g., cut tolerances for round wires). Current controlling slits allow to control of the current path or, more specifically, the length of the current path (which is effectively the "wire length") between two contact-forming portions 146 of conductive layer 140 regardless of the actual physical distance between contact-forming portions 146. It should be noted that to achieve such current controlling aspects, these slits need to have precise geometrical controls of the slit locations, shape, cross-section, and other geometric aspects that are not possible with some patterning techniques (e.g., chemical etching). The method described above allows the generation of conductive layer design 1220 to level/equalize the resistance of "long" and "short" traces (referring to the physical separation of contact-forming portions 146).

Conventional stamped busbars have very limited geometric options, especially for small features (e.g., features that are smaller than 100 micrometers). As such, stamped busbars cannot be easily reconfigured to achieve uniform current densities. This issue is particularly problematic in "high P" configurations (i.e., with 5+ or even 10+ sets of cells interconnected in parallel in the same battery module) that are difficult to package. This issue forces these cell sets to be grouped together in complex shapes and have different current paths in and out of bus bars driving different demands on the cells and exacerbating the misbalancing issue. The method described above allows the generation of conductive layer design 1220 with uniform busbar resistances for different sets of battery cells and different locations of these sets within a battery module. It should be noted that in some cases, some busbars (i.e., conductive islands of conductive layer 140) receive set of current controlling slits 1200 which causes the resistance increase (e.g., to match the resistance of other busbars). This resistance matching can be used to bring all parallel cell sets to a "uniform" state to ensure cell balancing within the module.

Finally, it should be noted that the method described above allows generating the conductive layer design 1220 can be used for flexible interconnect circuit 110 including multiple stacked conductive layers. These stacked conductive layers may have different thicknesses (e.g., one layer being at least 2 times thicker than the other layer) or have the same thickness (both layers between 200 micrometers and 400 micrometers). Furthermore, these stacked conductive layers may have different conductive layer designs or the same design. With the different conductive layer designs, some operations of method 1250 described above (e.g., determining the resistive heating map 1240) are performed simultaneously on all layers in the stack.

Flexible Interconnect Circuits with Battery Cell Support Bands

Figure 13A:
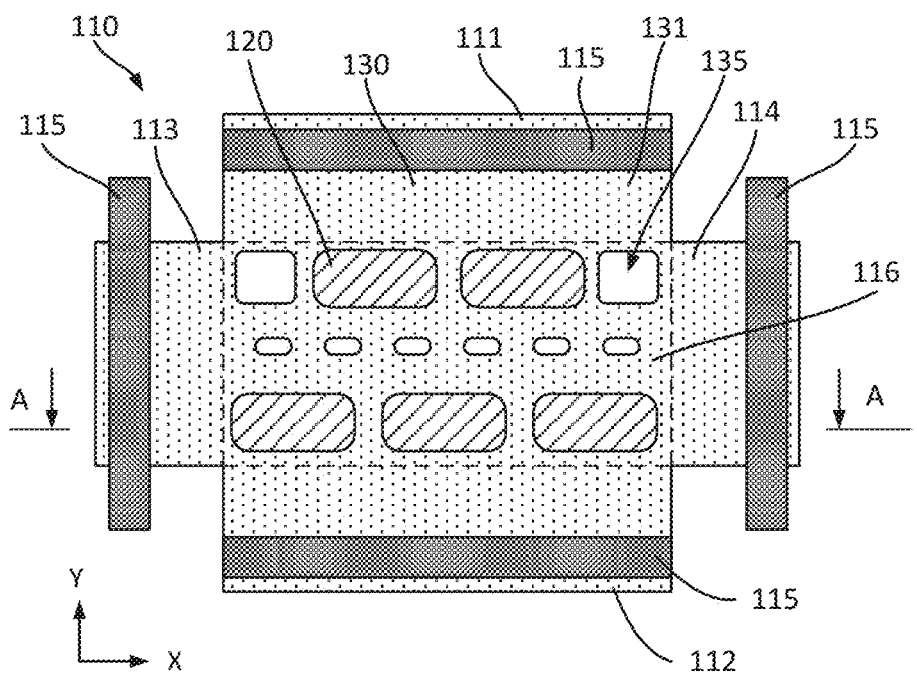
FIG. 13A is a schematic top view of a flexible interconnect circuit comprising a main portion and four flaps used for supporting battery-supporting straps, in accordance with some examples.
Figure 13B:
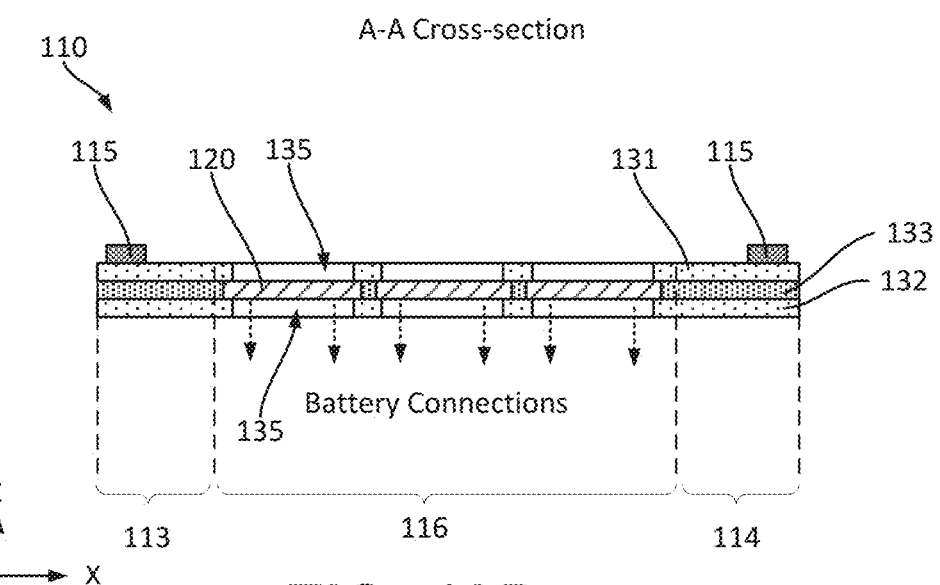
FIG. 13B is a schematic cross-sectional side view of the flexible interconnect circuit in FIG. 13A, in accordance with some examples.
Figure 13C:
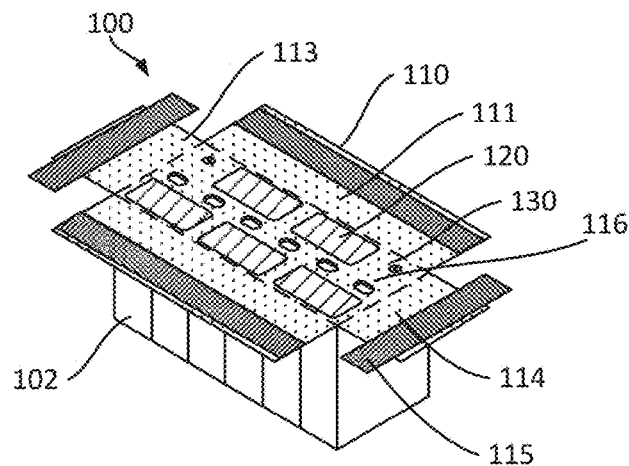
FIGS. 13C-13F are schematic views of the installation of the flexible interconnect circuit in FIG. 13A on a set of batteries, in accordance with some examples.
Figure 13D:
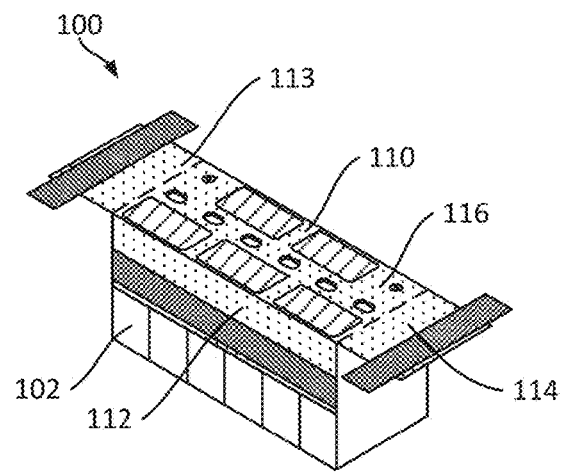
Figure 13E:
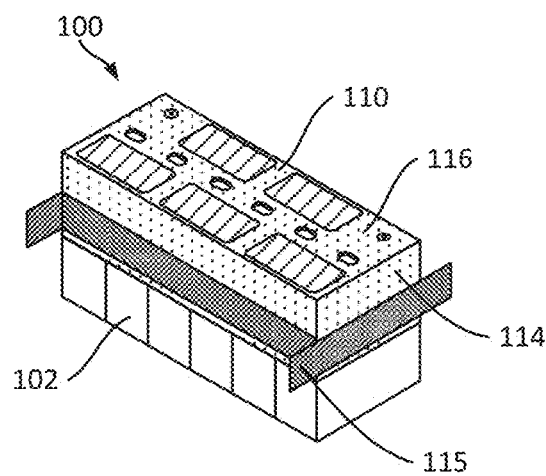
Figure 13F:
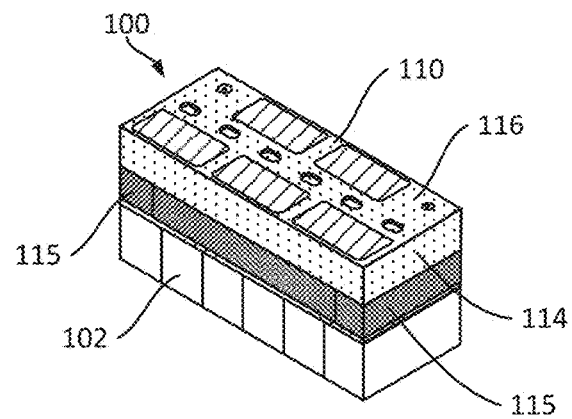

FIG. 13A is a schematic top view of flexible interconnect circuit 110 comprising one or more insulator layers 130 such as first insulator layer 131 and second insulator layer 132 (with first insulator layer 131 visible in FIG. 13A and both insulators visible in FIG. 13B). First insulator layer 131 or, more generally, insulator layers 130 comprise main portion 116 and four flaps, i.e., first flap 111, second flap 112, third flap 113, and fourth flap 114, in accordance with some examples. This example of flexible interconnect circuit 110 is designed to interconnect 6 prismatic cells in series, e.g., as schematically shown in FIGS. 13C-13F. Specifically, flexible interconnect circuit 110 comprises conductive components 120, which are parts of conductive layer 140. These conductive components 120 are supported by one or more insulator layers 130 such as first insulator layer 131 and second insulator layer 132 shown in FIG. 13B. Insulator layers 130 have 135 for providing access to conductive components 120 (e.g., while forming connections between conductive components 120 and battery cells) and/or directly to battery cells (e.g., two top corner openings in FIG. 13A). One having ordinary skill in the art would understand that various designs of conductive layer 140 are within the scope.

Referring to FIG. 13A, in this example, flexible interconnect circuit 110 comprises straps 115 that are used to interconnect the flaps with each other and/or to connect these flaps to the battery cells. In this example, straps 115 are supported on the flaps, e.g., one of the straps 115 on each of first flap 111, second flap 112, third flap 113, and fourth flap 114. However, in some examples, straps can be supported on main portion 116. Straps 115 are used to support batteries 102 relative to each other when flexible interconnect circuit 110 is installed on these batteries 102. For example, straps 115 can be joined together into one or more bands encircling the batteries 102. Various materials for straps 115 are within the scope (e.g., aluminum/AL 6061), steel, polymers, and other like materials.

Referring to FIG. 13B, straps 115 can be attached to various components of flexible interconnect circuit 110 such as insulator layers 130 or, more specifically, first insulator layer 131. For example, an adhesive layer can be used between straps 115 and first insulator layer 131. In some examples, both first insulator layer 131 and second insulator layer 132 form a stack with insulator openings 135, e.g., as shown in FIG. 13B. Alternatively, only one of insulator layers 130 can be used for supporting straps 115. When flexible interconnect circuit 110 has multiple insulator layers 130, these layers can be supported relative to each other with third insulator layer 133, which may be referred to as an inner insulator layer 133 and can be formed by various adhesive materials. In some examples, third insulator layer 133 can be used to support straps 115.

Referring to FIGS. 13C-13F, during the installation of flexible interconnect circuit 110 on batteries 102 (e.g., while forming battery pack 100), main portion 116 is positioned over and in contact with the top of batteries 102, while the flaps are folded and come in contact of the respective sides of batteries 102. Thereafter, straps 115 are interconnected forming a band around batteries 102. In this example, the flaps are positioned between straps 115 and conductive components 120 thereby insulating straps 115 from batteries 102. These insulation aspects provide additional safety functionality. For example, one or more instances of straps 115 can be used as current carrying components, e.g., a return busbar. Various connections between straps 115 are within the scope, e.g., welding, soldering, adhering, using mechanical fasteners, and the like.

One distinguishing feature of straps 115 described herein is their integration into flexible interconnect circuit 110, which greatly reduces the number of components needed for the assembly of battery pack 100. Furthermore, straps 115 are supported and aligned within flexible interconnect circuit 110 thereby significantly simplifying the assembly process. In other words, straps 115 are positioned on flexible interconnect circuit 110 such that during the installation of flexible interconnect circuit 110 on batteries 102, straps 115 are positioned at the desired locations relative to batteries 102. It should be noted that while the primary function of straps 115 is to support batteries 102 relative to each other, straps 115 also provide support of flexible interconnect circuit 110 relative to batteries 102, which is particularly important to reduce mechanical stresses on electrical connections between batteries 102 and conductive components 120 of flexible interconnect circuit 110. Finally, in some examples, straps 115 can be used as an electrical component (e.g., as a return bus bar) in addition to their mechanical support function.

Figure 13G:
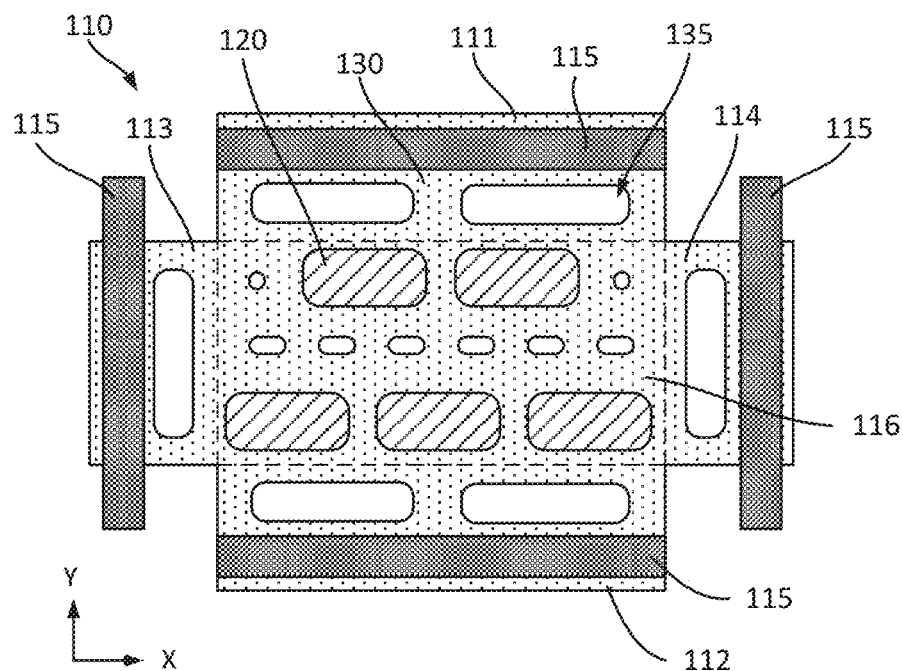
FIG. 13G is a schematic top view of a flexible interconnect circuit comprising a main portion and four flaps having openings for battery cooling, in accordance with some examples.

Referring to FIG. 13G, in some examples, flexible interconnect circuit 110 or, more specifically, the flaps, or even more specifically, insulator layers 130 in the flaps have insulator openings 135 that can be used for cooling of batteries 102, while these flaps extend over the sides of batteries 102. Specifically, such insulator openings 135 allow for a cooling fluid (gas, liquid) to come in direct contact with batteries 102. It should be noted that the flap material around insulator openings 135 should be sufficient to support straps 115 relative to main portion 116.

Figure 14A:
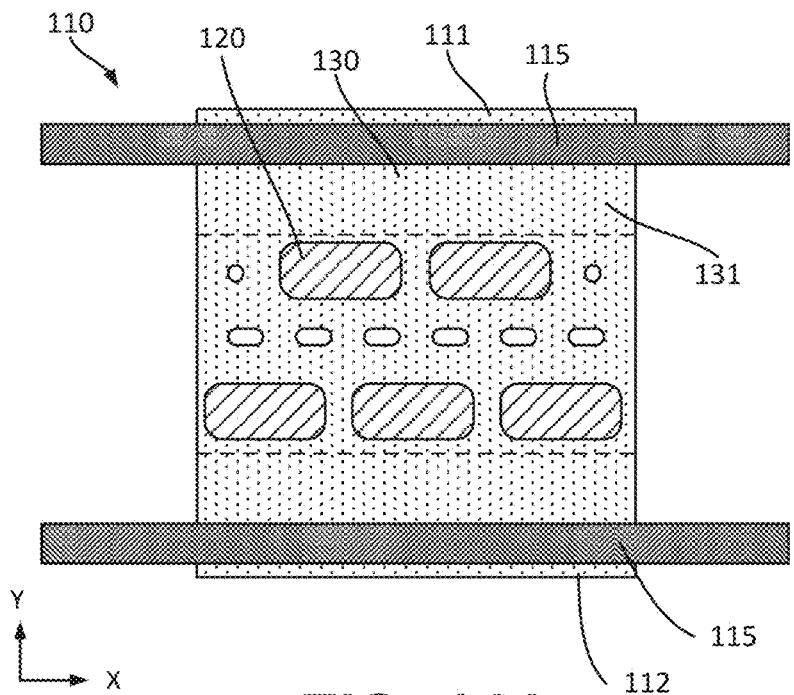
FIG. 14A is a schematic top view of a flexible interconnect circuit comprising a main portion and two flaps for supporting battery-supporting straps, in accordance with some examples.
Figure 14B:
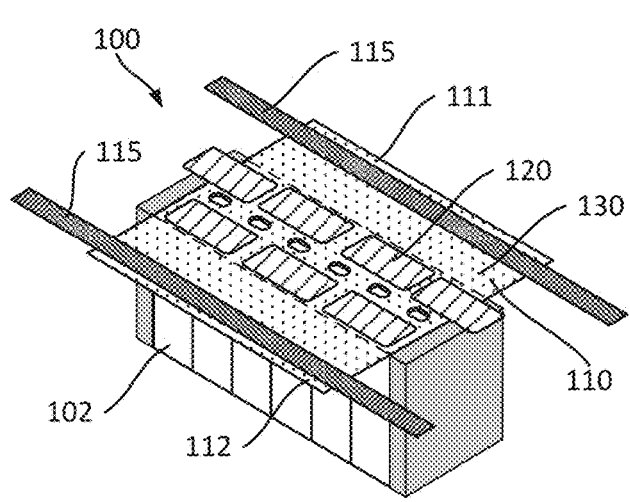
FIGS. 14B and 14C are schematic views of the installation of the flexible interconnect circuit in FIG. 14A on a set of batteries, in accordance with some examples.
Figure 14C:
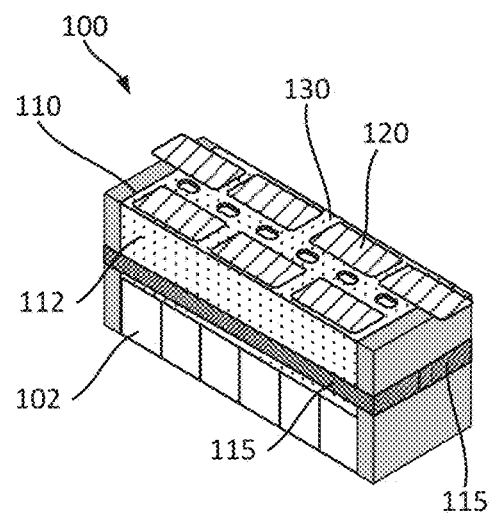

Referring to FIG. 14A, in some examples, flexible interconnect circuit 110 comprises only two flaps, e.g., first flap 111 and second flap 112. These two flaps support the straps 115 that extend away from these flaps to make connections with each other and/or other components of battery pack 100, e.g., as schematically shown in FIGS. 14B and 14C. For example, this strap extension (away from the flap) may be more than a half of the cell width to ensure that straps 115 overlaps as shown in FIG. 14C. This overlap ensures that straps 115 can be connected to each other. In some examples, the connection among straps 115 is used in addition to or instead of the connection between straps 115 and batteries 102. Alternatively, straps 115 are only connected to batteries 102 and not connected with any other of the straps 115.

Referring to FIGS. 14B and 14C, in some examples, straps 115 form a band around a stack that comprises batteries 102 as well as other components (e.g., end plates shown in FIG. 14A). These other components can house a BMS, cooling unit, and the like.

Figure 14D:
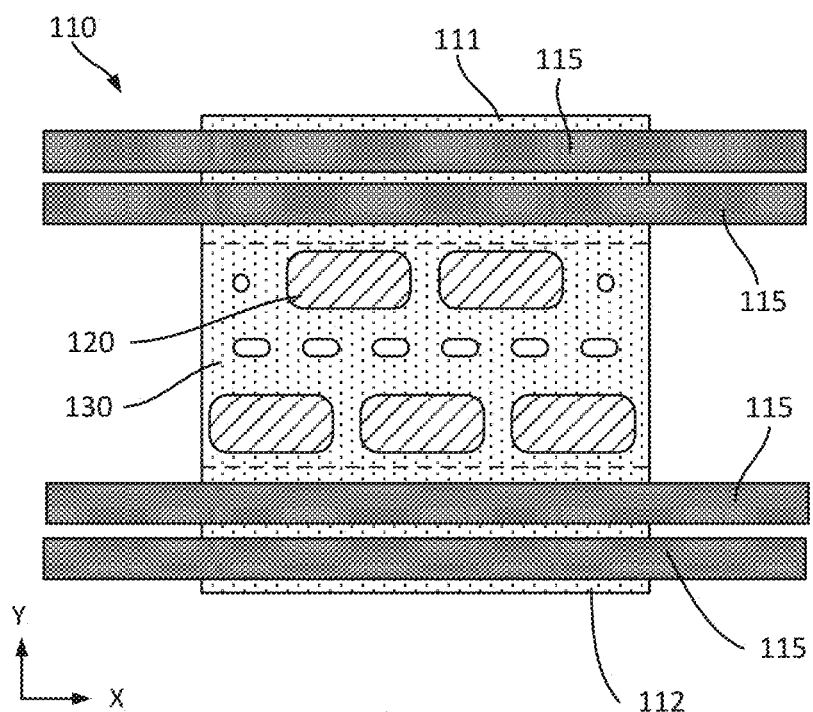
FIG. 14D is a schematic top view of a flexible interconnect circuit comprising a main portion and two flaps, each supporting two straps, in accordance with some examples.

Referring to FIG. 14D, in some examples, each flap supports multiple instances of straps 115, such as two straps, three straps, or more straps. Additional instances of straps 115 can be used to form additional bands around the cell stack, thereby providing additional support and redundancy (in case of one band fails).

Figure 15A:
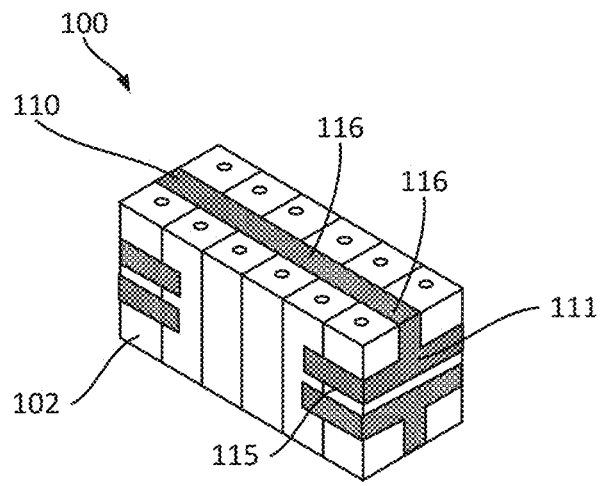
FIGS. 15A, 15B, and 15C are schematic views of different examples of a flexible interconnect circuit comprising battery-supporting straps.
Figure 15B:
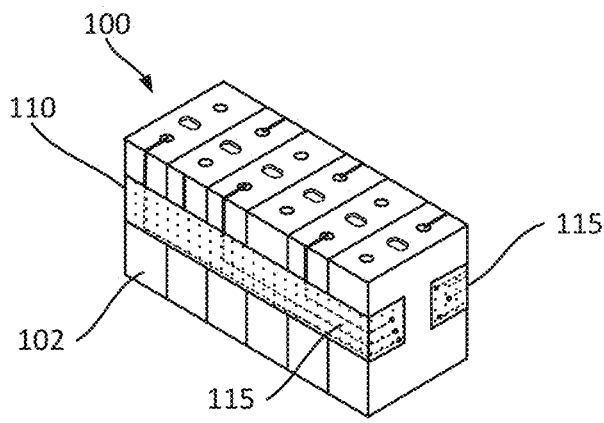
Figure 15C:
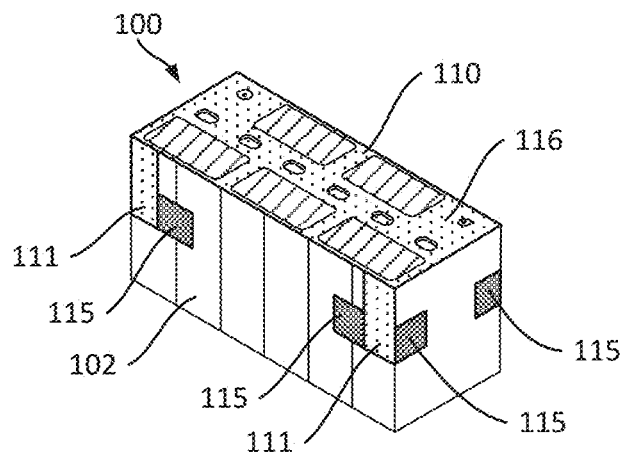
Figure 16A:
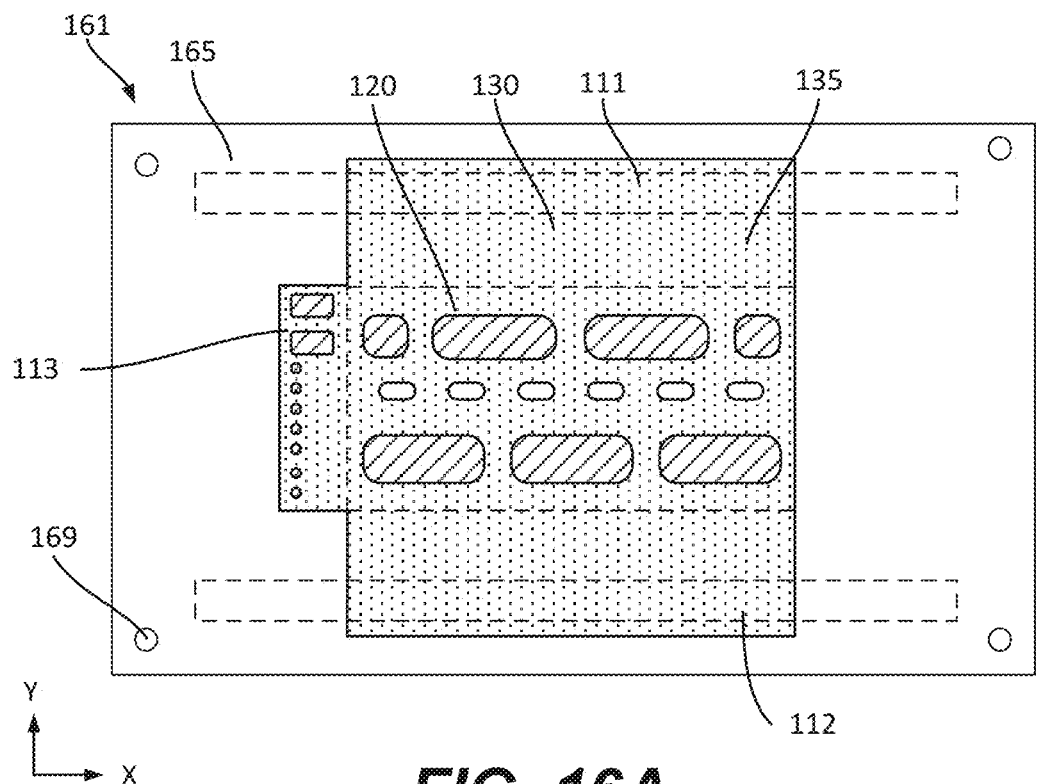
Figure 16B:
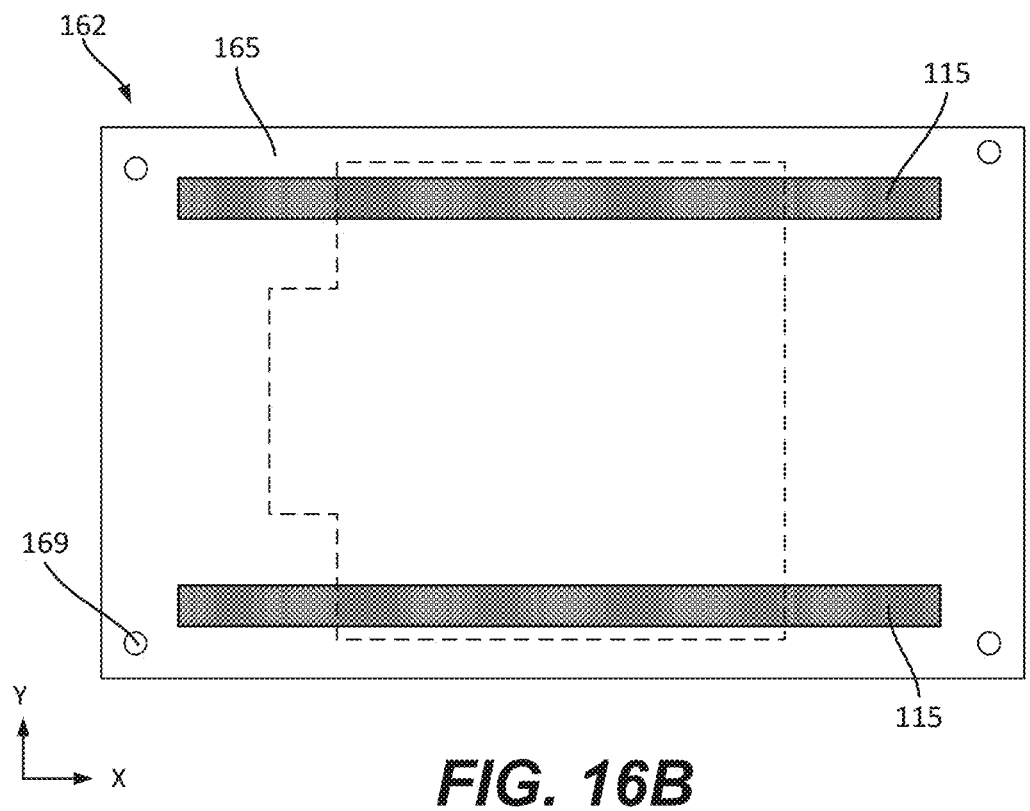

FIGS. 15A-15C illustrates additional examples of flexible interconnect circuit 110 that comprises straps 115. Specifically, FIG. 15A illustrates an example where one of straps 115 forms main portion 116, extending over the top of batteries 102. This strap can then form two flaps (with one flap visible in FIG. 15A). In each of these flaps, the strap branches/splits into two portions, extending in opposite directions from the "root" portion and, e.g., at 90° angle to this "root" portion. These "branch" portions of the strap can be folded over the battery edges and form connections to both sides of the end cells in the stack. In some examples (e.g., shown in FIG. 15A), this folded end of each "branch" portion extends over and adhered to the multiple batteries. When straps 115 are formed from a conductive material, additional materials can be used for insulating straps 115 from batteries 102 (e.g., one of insulator layers 130 can extend and provide adhesion between straps 115 and batteries 102). Alternatively, straps 115 are electrically coupled to the sides of batteries 102 and can be used for grounding these batteries 102.

FIG. 15B illustrates an example where two separate units of straps 115 do not overlap and form only a partial encircling band around the battery stack. In this example, straps 115 do not extend over the top of batteries 102. However, in this example, straps 115 integrate voltages traces. In this example, straps 115 can be formed using a stack of insulator layers with a conductive layer (forming these voltage traces) positioned in between conductive layers. In some examples (not shown), straps 115 extend to the points in battery pack 100 where the voltage traces are connected to other components (e.g., conductive components 120 of flexible interconnect circuit 110 and/or cell terminals).

FIG. 15C illustrates an example of flexible interconnect circuit 110 comprising main portion 116 and two flaps (with first flap 111 visible in FIG. 15C). Each of these two flaps comprises two edge portions extending along the edges of the stack. Furthermore, each of these edge portions is connected to the two straps (or one long strap extending through the edge portion). One of these straps 115 is attached to the same side of the battery stack as the flap edge portion. The other one of these straps 115 folds over the stack edge and is attached to another side (e.g., a face) of the stack. In other words, the two straps are connected to the two sides of the stack that end perpendicular to each other.

FIGS. 16A-16E are different components of flexible interconnect circuit 110 and stages of forming flexible interconnect circuit 110, in accordance with some examples. Specifically, FIG. 16 illustrates first circuit subassembly 161 comprising all circuit components other than straps 115. For example, first circuit subassembly 161 comprises insulator layers 130 and conductive components 120. Insulator layers 130 form three flaps, i.e., first flap 111, second flap 112, and third flap 113. First flap 111 and second flap 112 are used for supporting straps 115, which are introduced as a part of second circuit subassembly 162, shown in FIG. 16B. In this example, first flap 111 and second flap 112 are free from conductive components 120. However, third flap 113 can include conductive components 120 as further described below with reference to 16C.

First circuit subassembly 161 also comprises first temporary liner 165, which is used for supporting various components of first circuit subassembly 161 while fabricating flexible interconnect circuit 110. First temporary liner 165 is not a part of flexible interconnect circuit 110. In some examples, first temporary liner 165 comprises alignment features 169, e.g., for aligning first circuit subassembly 161 relative to second circuit subassembly 162 or, more specifically, for aligning first flap 111 and second flap 112 relative to straps 115 during the fabrication of flexible interconnect circuit 110.

FIG. 16C is a schematic illustration of conductive components 120 of flexible interconnect circuit 110 with all other components now shown. The boundaries of first temporary liner 165 and insulator layers 130 are shown with dashed lines for reference. Specifically, FIG. 16C illustrates the integration of a return bus bar and voltage traces into conductive components 120. In some examples, all of these components can be formed from the same conductive layer 140.

FIG. 16D is a schematic illustration of first insulator layer 131 illustrating various insulator openings 135 providing access to conductive components 120 (shown in FIG. 16C). Similarly, FIG. 16E is a schematic illustration of second insulator layer 132 also illustrating insulator openings 135 providing similar access to conductive components 120 but from another side. Conductive components 120 or, more generally, conductive layer 140 is positioned between first insulator layer 131 and second insulator layer 132.

CONCLUSION

It is to be understood that the above description is intended to be illustrative, and not restrictive. For example, the above-described examples (and/or aspects thereof) may be used in combination with each other. In addition, many modifications may be made to adapt a particular situation or material to the teachings presented herein. Dimensions, types of materials, orientations of the various components, and the number and positions of the various components described herein are intended to define parameters of some examples and are by no means limiting and are merely examples. Many examples and modifications within the spirit and scope of the claims will be apparent to those of skill in the art upon reviewing the above description.

The invention claimed is:
1. A method of fabricating a flexible interconnect circuit comprising a set of current controlling slits, the method comprising:
receiving a conductive layer design corresponding to a conductive layer of the flexible interconnect circuit, wherein the conductive layer design comprises design-contact-forming portions corresponding to contact-forming portions of the conductive layer;
determining a resistive heating map for the conductive layer based on an electric current map comprising target current values, wherein:
each of the target current values corresponds to one of the design-contact-forming portions and represents a maximum current to be flowed through a corresponding one of the contact-forming portions, and
the resistive heating map comprises heating rate values for different points in the conductive layer design; and
when any of the heating rate values in the resistive heating map falls outside of resistive-heating-map limits, adding or changing a design set of current controlling slits in the conductive layer design and determining the resistive heating map using the conductive layer design with the design set of current controlling slits until all of the heating rate values in the resistive heating map are within the resistive-heating-map limits; and patterning the conductive layer in accordance with the conductive layer design comprising the design set of current controlling slits, wherein patterning the conductive layer comprises forming the set of current controlling slits corresponding to the design set of current controlling slits.

2. The method of claim 1, wherein each slit in the design set of current controlling slits has a width (W) of less than 1 millimeter.

3. The method of claim 1, wherein each slit in the design set of current controlling slits has an aspect ratio of a slit width (W) to a slit depth (D) of less than 10.

4. The method of claim 1, wherein at least one slit in the design set of current controlling slits is a through slit forming a full separation between two portions of the conductive layer design.

5. The method of claim 1, wherein at least one slit in the design set of current controlling slits is a partial slit providing only a partial separation between two portions of the conductive layer design and maintaining a part monolithic contact between the two portions.

6. The method of claim 5, wherein the partial slit has a ratio of a slit depth (D) to a conductive layer thickness (T) of greater than 0.5.

7. The method of claim 1, wherein the design set of current controlling slits in the conductive layer design is updated to provide resistances between set pairs of the contact-forming portions within resistance limits.

8. The method of claim 1, wherein determining the resistive heating map for the conductive layer comprises accounting for environmental heat losses by the conductive layer.

9. The method of claim 1, wherein the conductive layer at least partially overlaps with and adheres to a first insulator layer.

10. The method of claim 9, wherein at least one slit in the set of current controlling slits at least partially overlaps with the first insulator layer.

11. The method of claim 9, wherein the conductive layer at least partially extends between the first insulator layer and a second insulator layer.

12. The method of claim 1, wherein the resistive-heating-map limits comprise multiple different current density values for different portions of the conductive layer design.

13. The method of claim 1, wherein the resistive-heating-map limits comprise multiple different heating rate values for different portions of the conductive layer design.

14. The method of claim 13, wherein the multiple different heating rate values of the resistive-heating-map limits are determined from current densities in the different portions of the conductive layer design.

15. The method of claim 14, wherein updating the design set of current controlling slits in the conductive layer design is performed until the current densities in the different portions of the conductive layer design are within current density limits.

16. The method of claim 1, wherein determining the resistive heating map is performed using computer modeling.

17. The method of claim 1, wherein the conductive layer is formed from aluminum.

18. The method of claim 1, wherein the conductive layer has a thickness of at least 100 micrometers.

19. The method of claim 1, wherein the flexible interconnect circuit is configured for interconnecting batteries.

* * * * *